(12) United States Patent
Jun et al.

(10) Patent No.: US 11,309,405 B2
(45) Date of Patent: Apr. 19, 2022

(54) VERTICAL FIELD EFFECT TRANSISTOR DEVICE HAVING PROTRUDED SHALLOW TRENCH ISOLATION AND METHOD FOR MANUFACTURING THE SAME

(71) Applicant: SAMSUNG ELECTRONICS CO., LTD., Suwon-si (KR)

(72) Inventors: Hwi Chan Jun, Suwon-si (KR); Min Gyu Kim, Suwon-si (KR); Seon Bae Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 2 days.

(21) Appl. No.: 16/846,813

(22) Filed: Apr. 13, 2020

(65) Prior Publication Data
US 2020/0403087 A1 Dec. 24, 2020

Related U.S. Application Data

(60) Provisional application No. 62/862,839, filed on Jun. 18, 2019.

(51) Int. Cl.
*H01L 29/66* (2006.01)
*H01L 29/78* (2006.01)
*H01L 29/423* (2006.01)
*H01L 21/8234* (2006.01)

(52) U.S. Cl.
CPC .......... *H01L 29/66666* (2013.01); *H01L 21/823487* (2013.01); *H01L 29/4236* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 8,502,186 | B2 | 8/2013 | Chung |
| 9,070,742 | B2 | 6/2015 | Xie et al. |
| 9,666,578 | B1 | 5/2017 | Anderson |
| 9,728,542 | B1 | 8/2017 | Balakrishnan et al. |
| 10,002,962 | B2 | 6/2018 | Anderson et al. |
| 10,056,289 | B1 * | 8/2018 | Cheng .............. H01L 29/78642 |
| 10,083,871 | B2 | 9/2018 | Cheng et al. |

(Continued)

*Primary Examiner* — Hsien Ming Lee
(74) *Attorney, Agent, or Firm* — Sughrue Mion, PLLC

(57) ABSTRACT

A method for manufacturing a vertical field effect transistor (VFET) device may include: providing an intermediate VFET structure including a substrate, a plurality of fin structures formed thereon, and a doped layer formed on the substrate between the fin structures, the doped layer comprising a bottom source/drain (S/D) region; forming a shallow trench through the doped layer and the substrate below a top surface of the substrate and between the fin structures, to isolate the fin structures from each other; filling the shallow trench and a space between the fin structures with an insulating material; etching the insulating material filled between the fin structures above a level of a top surface of the doped layer, except in the shallow trench, such that a shallow trench isolation (STI) structure having a top surface to be at or above a level of the top surface of the doped layer is formed in the shallow trench; forming a plurality of gate structures on the fin structures, respectively; and forming a top S/D region above the fin structures.

18 Claims, 33 Drawing Sheets

(56) References Cited

U.S. PATENT DOCUMENTS

| | | | |
|---|---|---|---|
| 10,090,303 B2 | 10/2018 | Cheng | |
| 10,128,158 B2 | 11/2018 | Anderson et al. | |
| 10,276,687 B1* | 4/2019 | Bao | H01L 21/02164 |
| 10,283,416 B2 | 5/2019 | Mallela et al. | |
| 2018/0122913 A1 | 5/2018 | Xie et al. | |
| 2018/0226491 A1 | 8/2018 | Bi et al. | |
| 2020/0135873 A1* | 4/2020 | Wu | H01L 21/823431 |

* cited by examiner

VERTICAL FIELD EFFECT TRANSISTOR DEVICE HAVING PROTRUDED SHALLOW TRENCH ISOLATION AND METHOD FOR MANUFACTURING THE SAME

CROSS-REFERENCE TO THE RELATED APPLICATION

This application claims priority from U.S. Provisional Application No. 62/862,839 filed on Jun. 18, 2019 in the U.S. Patent and Trademark Office, the disclosure of which is incorporated herein in its entirety by reference.

BACKGROUND

1. Field

Apparatuses and methods consistent with exemplary embodiments of the inventive concept relate to structure of a vertical field effect transistor (VFET) and manufacturing of the same.

2. Description of the Related Art

A VFET is fabricated or manufactured by forming a vertical fin, used for a channel for current flow, on a semiconductor substrate, a bottom source/drain (S/D) region and a top S/D region below and on the vertical fin, and a gate structure on a sidewall of the vertical fin. Thus, a current flows in the VFET in a direction perpendicular to the semiconductor substrate unlike a lateral current flow in the related art planar FET or finFET.

As a VFET device formed of the VFETs are known as having various advantages including a high-density structure over the planar FET or finFET devices, more improved structures and methods of manufacturing the VFET device have been sought.

SUMMARY

Various embodiments of the inventive concept may provide an improved method for manufacturing a VFET device and a VFET device manufactured thereby.

According to an aspect of an exemplary embodiment, there is provided a method for manufacturing a VFET device which may include: providing an intermediate VFET structure including a substrate, a plurality of fin structures formed thereon, and a doped layer formed on the substrate between the fin structures, the doped layer including a bottom source/drain (S/D) region; forming a shallow trench through the doped layer and the substrate below a top surface of the substrate and between the fin structures, to isolate the fin structures from each other; filling the shallow trench and a space between the fin structures with an insulating material; etching the insulating material filled between the fin structures above a level of a top surface of the doped layer, except in the shallow trench, such that a shallow trench isolation (STI) structure having a top surface to be at or above the level of the top surface of the doped layer is formed in the shallow trench; forming a plurality of gate structures on the fin structures, respectively; and forming a top S/D region above the fin structures.

According to an aspect of an exemplary embodiment, there is provided a method for manufacturing a VFET device which may include: providing an intermediate VFET structure comprising a substrate, a plurality of fin structures formed thereon, and a doped layer formed on the substrate between the fin structures, the doped layer comprising a bottom S/D region; forming a shallow trench through the doped layer and the substrate below a top surface of the substrate and between the fin structures, to isolate the fin structures from each other; filling a space between the fin structures including the shallow trench with an insulating material; etching the insulating material such that the insulating material filled between the fin structure and above the shallow trench is delay-etched compared to the insulating material filled in positions between the shallow trench and the fin structures to form an STI structure in the shallow trench; forming a plurality of gate structures on the fin structures, respectively; and forming a top S/D region above the fin structure.

According to an aspect of an exemplary embodiment, there is provided a VFET device which may include: a substrate; a doped layer formed on the substrate by doping impurities, the doped layer comprising a bottom S/D region; a plurality of fin structures vertically formed on the substrate above the doped layer; a top S/D region formed above the fin structures; and an STI structure filling a shallow trench formed through the doped layer and the substrate below a top surface of the substrate and between the fin structures, wherein a top surface of the STI structure is at or above a level of a top surface of the doped layer.

BRIEF DESCRIPTION OF THE DRAWINGS

The above and other aspects of inventive concepts will become more apparent to those of ordinary skill in the art by describing in detail example embodiments thereof with reference to the accompanying drawings, in which.

DETAILED DESCRIPTION

Figure 1A:
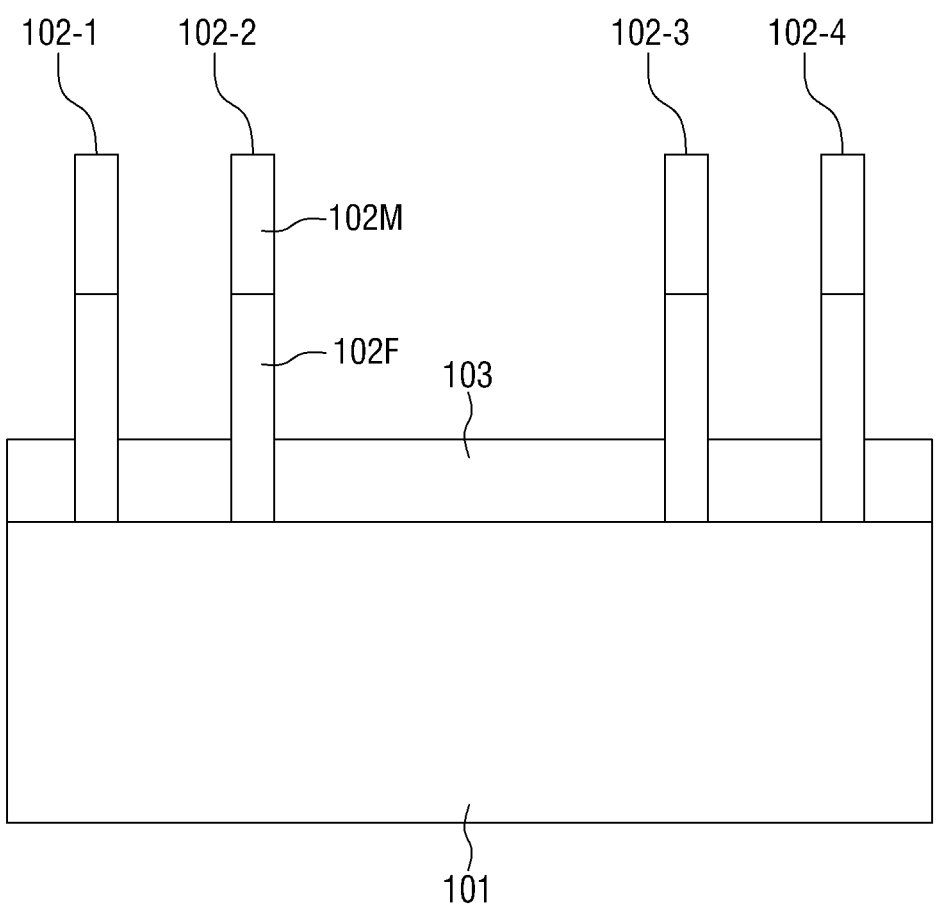
FIGS. 1A through 1I illustrate cross-sectional side views of a method of manufacturing a VFET device structure, according to an embodiment.

Various embodiments of the inventive concept will be described more fully hereinafter with reference to the accompanying drawings. These embodiments are all exemplary, and may be embodied in many different forms and should not be construed as limiting the inventive concept. Rather, these embodiments are merely provided so that this disclosure will be thorough and complete, and will fully convey the inventive concept to those skilled in the art. In the drawings, the sizes and relative sizes of the various layers and regions may have been exaggerated for clarity, and thus, the drawings are not necessarily to scale, some features may be exaggerated to show details of particular components or elements. Therefore, specific structural and functional details disclosed herein are not to be interpreted as limiting, but merely as a representative basis for teaching one skilled in the art to variously employ the methods and structures of the embodiments.

An embodiment provided herein is not excluded from being associated with one or more features of another example or another embodiment also provided herein or not provided herein but consistent with the inventive concept. For example, even if matters described in a specific embodiment are not described in a different embodiment, the matters may be understood as being related to or combined with the different embodiment, unless otherwise mentioned in descriptions thereof.

For the purposes of the description hereinafter, the terms "upper", "lower", "top", "bottom", "left," and "right," and derivatives thereof can relate, based on context, to the disclosed structures, as they are oriented in the drawings. The same numbers in different drawings may refer to the same structural component or element thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 1I illustrate cross-sectional side views of a method of manufacturing a VFET device structure, according to an embodiment.

FIG. 1A shows an intermediate VFET device structure 100, in which a substrate 101 is provided and a plurality of fin structures 102-1 through 102-4 are vertically formed thereon. Each of the fin structures 102-1 through 102-4 may include a fin 102F and a mask 102M formed thereon. However, depending on a choice of a manufacturing process, the mask 102M may not be included in the each of the fin structures 102-1 through 102-4. The fin structures 102-1 and 102-2 and the fin structures 102-3 and 102-4 are spaced apart so that VFETs formed around the fin structures 102-1 and 102-2 are isolated from VFETs formed around the fin structures 102-3 and 102-4 for design purposes of a VFET device to be constituted from the intermediate VFET device structure 100. The isolation of the VFETs is to be performed through forming an insulating structure such as a shallow trench isolation (STI) structure between the fin structures 102-1 and 102-2 and the fin structures 102-3 and 102-4 to be described later.

In FIG. 1A, the substrate 101 and the fin 102F may be formed of a single element semiconductor material such as silicon (Si), germanium (Ge), or their compound (SiGe). The mask 102F formed on the fin 102F may include a dielectric material such as silicon nitride (SiN) to be used to pattern the fin 102F on the substrate 101. In addition, the intermediate VFET structure 100 includes a doped layer 103 which is formed by epitaxially growing a semiconductor layer on the substrate 101 and doping impurities therein. A material forming the doped layer 103 may be similar to that forming the substrate 101. The impurities doped in the doped layer 103 may be boron or its combination to form a p-type VFET, or phosphorus, arsenic, indium or their combination to form an n-type VFET, when the intermediate VFET device structure 100 is finished. The doped layer 103 is provided to form a bottom source/drain (S/D) region of a VFET of the intermediate VFET device structure 100.

Figure 1B:
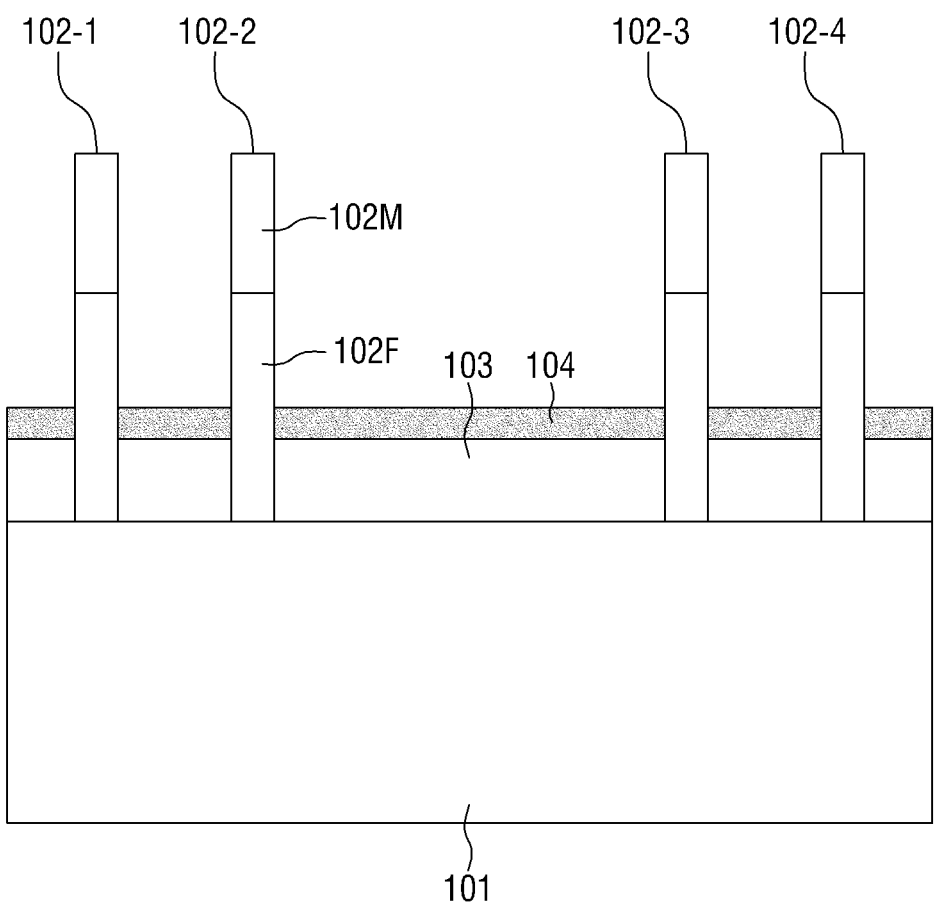

FIG. 1B shows that a bottom spacer 104 is deposited on a top surface of the doped layer 103 between the fin structures 102-1 through 102-4 to insulate the doped layer 103 from neighboring elements such as a gate structure to be discussed later. The bottom spacer 104 may include a low-κ dielectric material such as silicon oxide (SiO), silicon nitride (SiN), silicon oxynitride (SiON), carbon-doped silicon nitride (SiCN), silicon oxynitride (SiON), silicon boro crbonitride (SiBCN), silicon oxycarbonitride (SiOCN), or combinations thereof, not being limited thereto. The bottom spacer 104 may be formed on the doped layer 103 by at least one of methods such as chemical vapor deposition (CVD), plasma-enhanced VD (PEVD), physical vapor deposition (PVD), atomic layer deposition (ALD), plasma-enhanced ALD (PEALD), anisotropic deposition, etc., not being limited thereto.

Figure 1C:
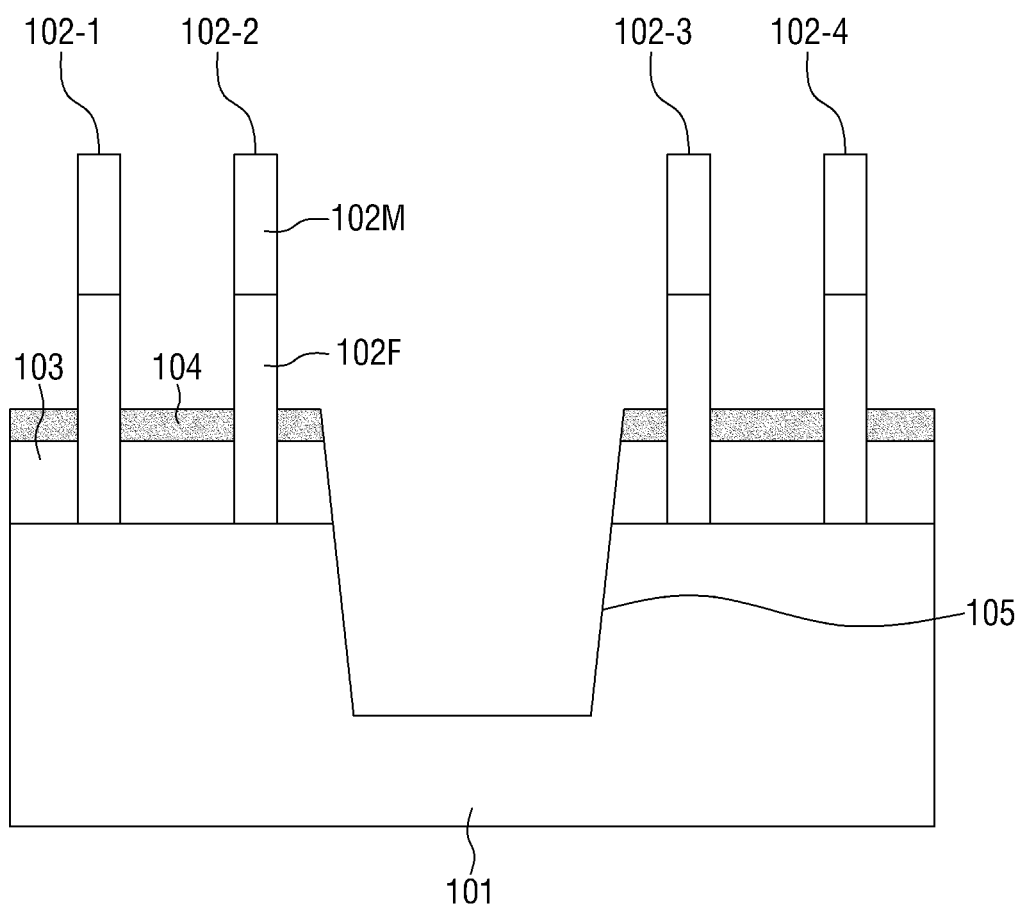

FIG. 1C shows that a shallow trench 105 is etched from the bottom spacer 104 and the doped layer 103 into the substrate 101 to provide a space for the STI to be processed later. The method used for the etching in this process may be dry etching, not being limited thereto.

Figure 1D:
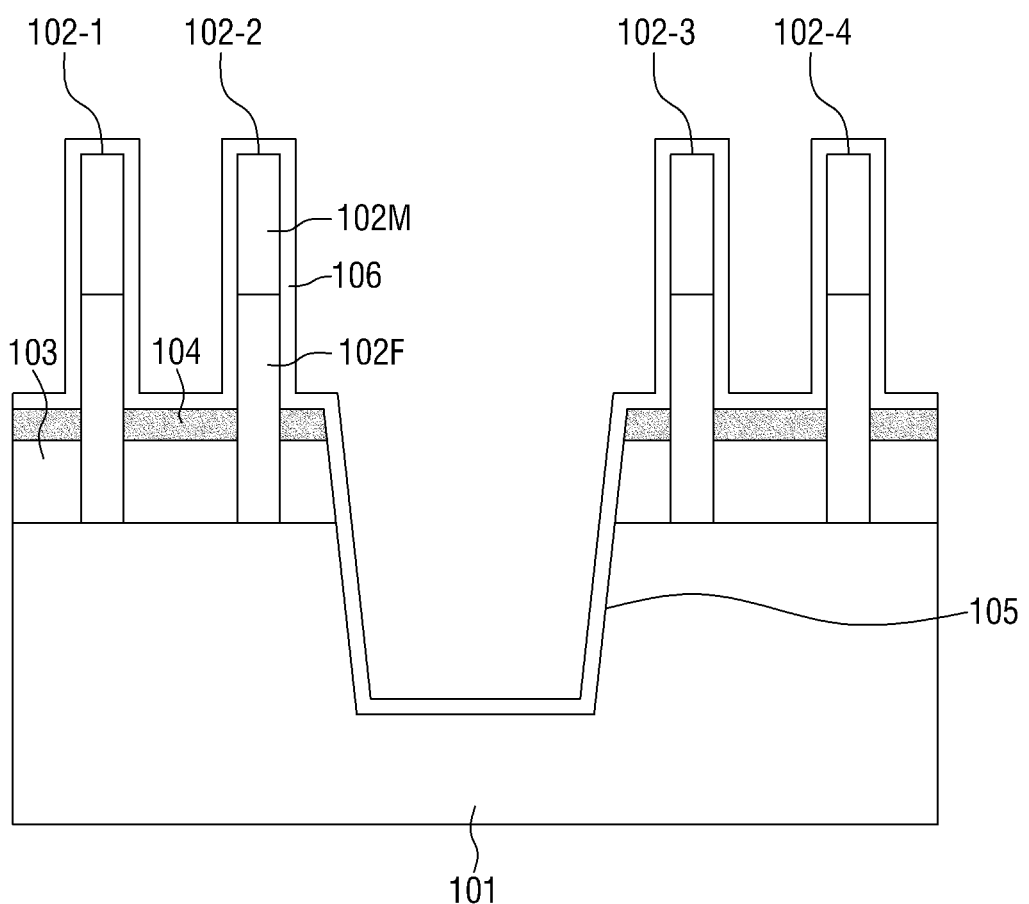

FIG. 1D shows that, prior to forming the STI, a dielectric layer 106 including a material such as SiN is lined or deposited by a method such as ALD, not being limited thereto, along outer surfaces of the fin structures 102-1 through 102-4, a top surface of the bottom spacer 104 between the fin structures 102-1 through 102-4, and a surface of the shallow trench 105, to prevent damages such as oxidation of these elements from a follow-on STI process which uses an oxide material.

Figure 1E:
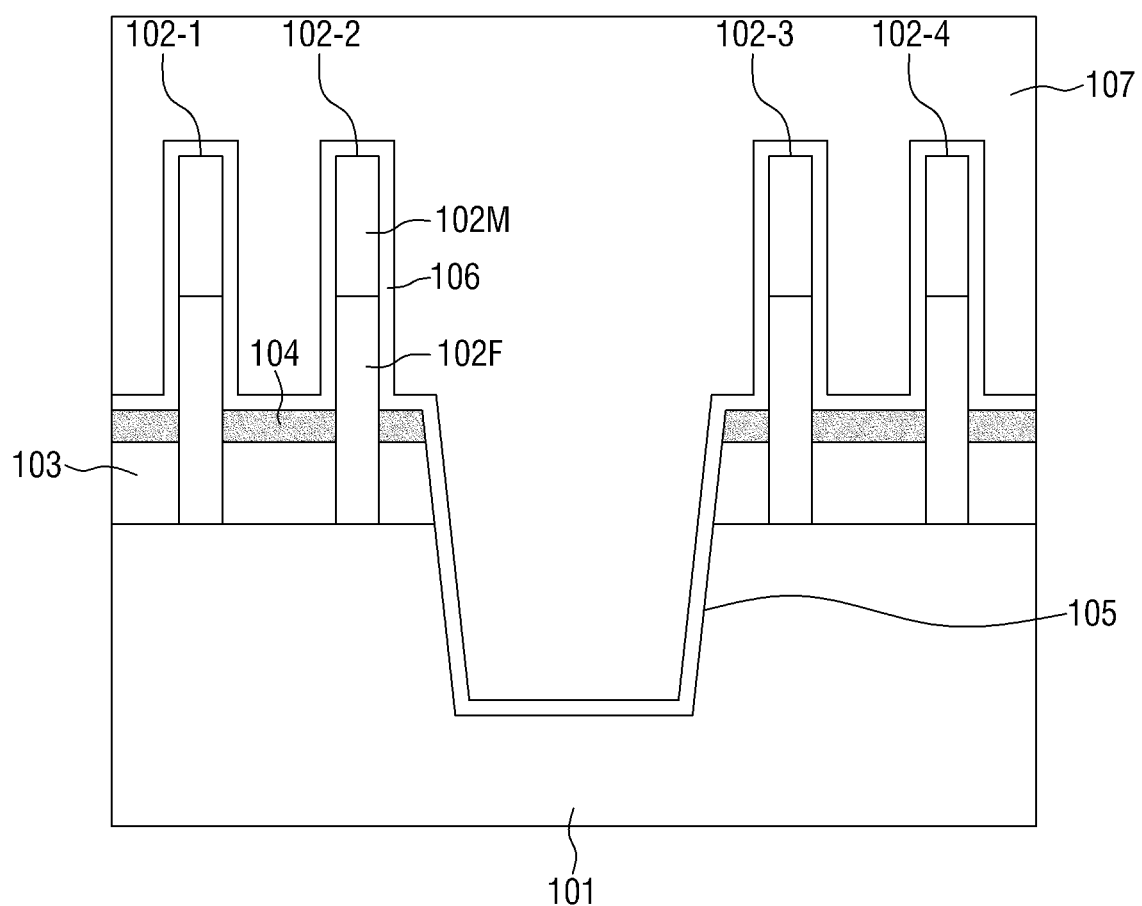

FIG. 1E shows that an STI dielectric 107, which is an insulating material, is deposited, by a method such as CVD or floating vapor CVD, not being limited thereto, on the dielectric layer 106 covering the outer surfaces of the fin structures 102-1 through 102-4, the top surface of the bottom spacer 104 between the fin structures 102-1 through 102-4, and the surface of the shallow trench 105, to completely fill the space between the fin structures 102-1 through 102-4 as well as the shallow trench 105. The STI dielectric 107 used in this deposition process may be formed of a dielectric oxide material such as SiO, silicon dioxide ($SiO_2$), silicon oxynitride ($SiO_xN_y$) or their combination, not being limited thereto, having etch selectively over the dielectric layer 106.

Figure 1F:
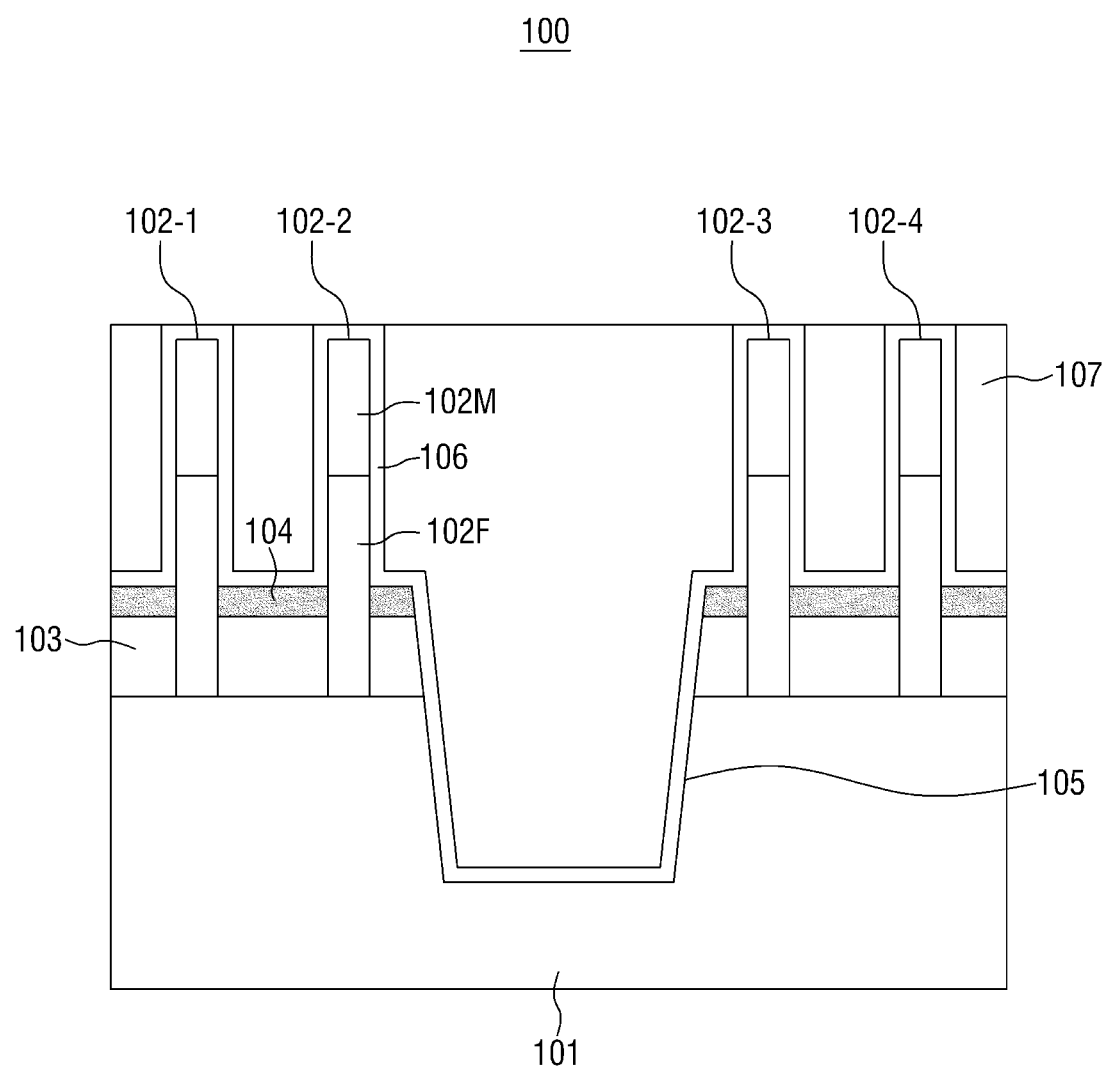

FIG. 1F shows that the STI dielectric 107 is planarized (or polished) by a method such as chemical mechanical planarization (CMP), not being limited thereto, so that a top surface of the planarized STI dielectric 107 is coplanar with top surfaces of the fin structures 102-1 through 102-4, and the dielectric layer 106 lined on the top surfaces of the fin structures 102-1 through 102-4 are exposed.

Figure 1G:
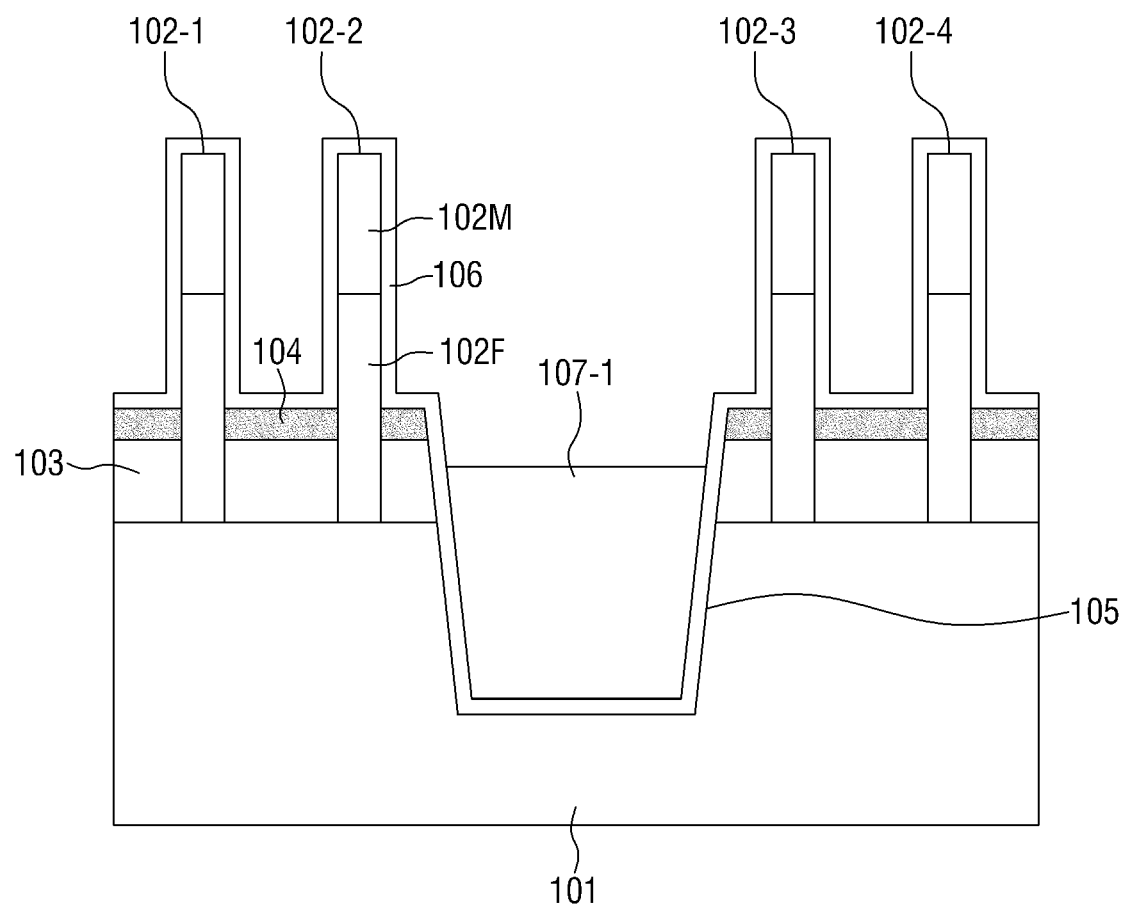

FIG. 1G shows that the planarized STI dielectric 107 is etched by dry etching or wet etching, not being limited thereto, to reveal the fin structures 102-1 through 102-4 on which the dielectric layer 106 is lined and form an STI structure 107-1. Here, even after the etching of the planarized STI dielectric 107, the dielectric layer 106 still remains on the outer surfaces of the fin structures 102-1 through 102-4, the top surface of the bottom spacer 104, and side surfaces of the bottom spacer 104 and portions of side surfaces of the doped layer 104 forming the surface of the shallow trench 105 because the dielectric layer 106 is formed of the material such as SiN having etch selectivity against the material forming the STI dielectric 107 such as SiO or $SiO_2$.

Meanwhile, referring to FIG. 1G, while the STI dielectric 107 disposed between the fin structures 102-1 through 102-4 is completely removed by the etching to later form a gate structure on the fin structures 102-1 through 102-4, the STI dielectric 107 disposed at a position above the shallow trench 105 may be over-recessed below a level of a top surface of the doped layer 103. Thus, the STI structure 107-1 formed by the etching in the process of FIG. 1G has a top surface below a level of a top surface of the doped layer 103.

Figure 1H:
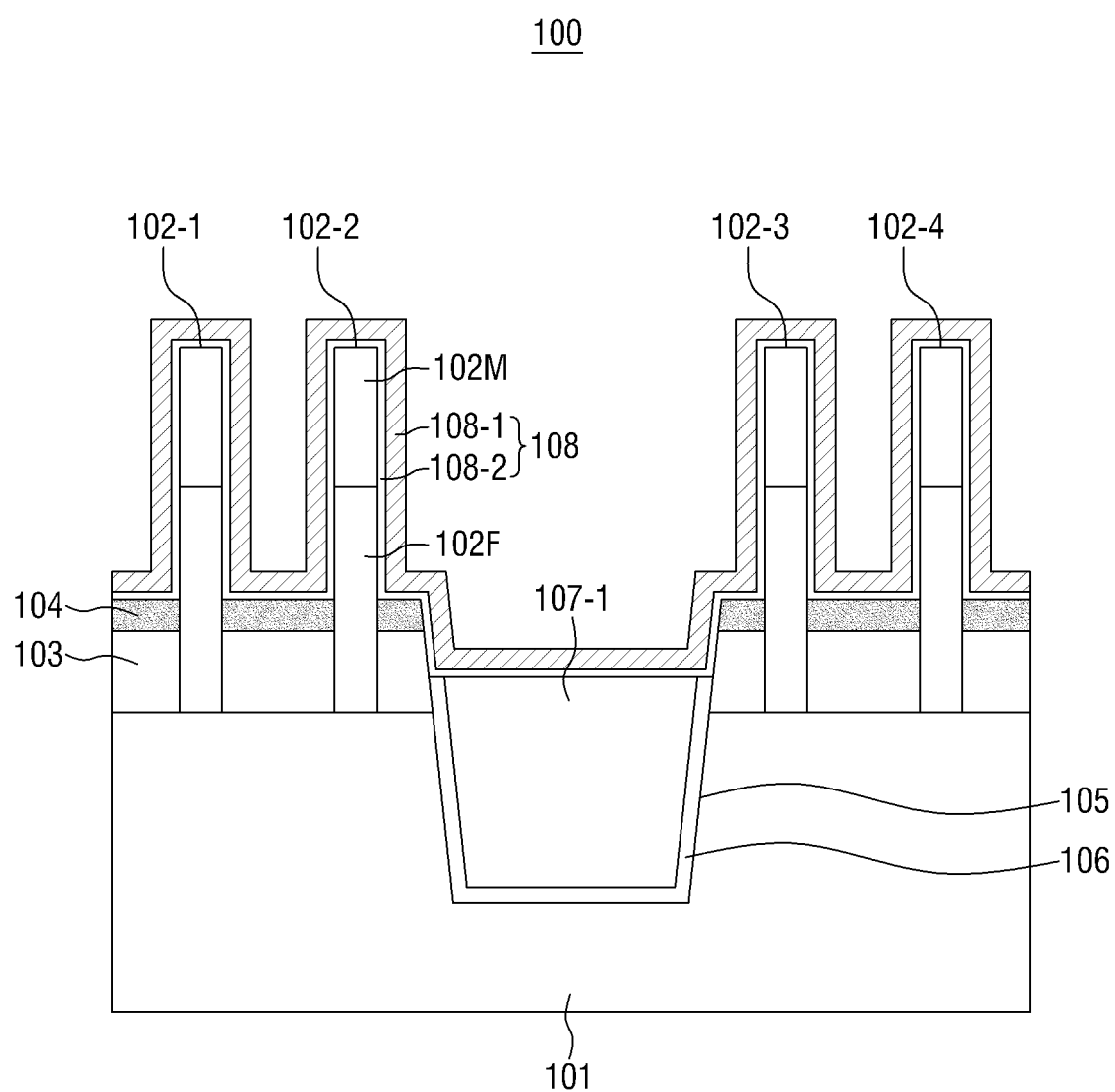

FIG. 1H shows that, after the dielectric layer 106 is stripped out (not shown) from the outer surfaces of the fin structures 102-1 through 102-4, the top surface of the bottom spacer 104, and the side surfaces of the bottom spacer 104 and the portions of the side surfaces of the doped layer 104 forming the surface of the shallow trench 106, a gate structure 108 is deposited thereon and the top surface of the STI structure 107-1 formed by the etching process in the process of FIG. 1G. The deposition of the gate structure 108 may be performed by a method such as ALD not being limited thereto. The gate structure 108 may include a conductor layer 108-1 formed of a metal or metal compound such as Cu, Al, Ti, Ta, W, Co, TiN, WN, TiAl, TiAlN, TaN, TiC, TaC, TiAlC, TaCN, TaSiN, or a combination thereof, not being limited thereto, and a high-κ layer 108-2 formed of a metal oxide material or a metal silicate such as Hf, Al, Zr, La, Mg, Ba, Ti, Pb, or a combination thereof, not being limited thereto.

Figure 1I:
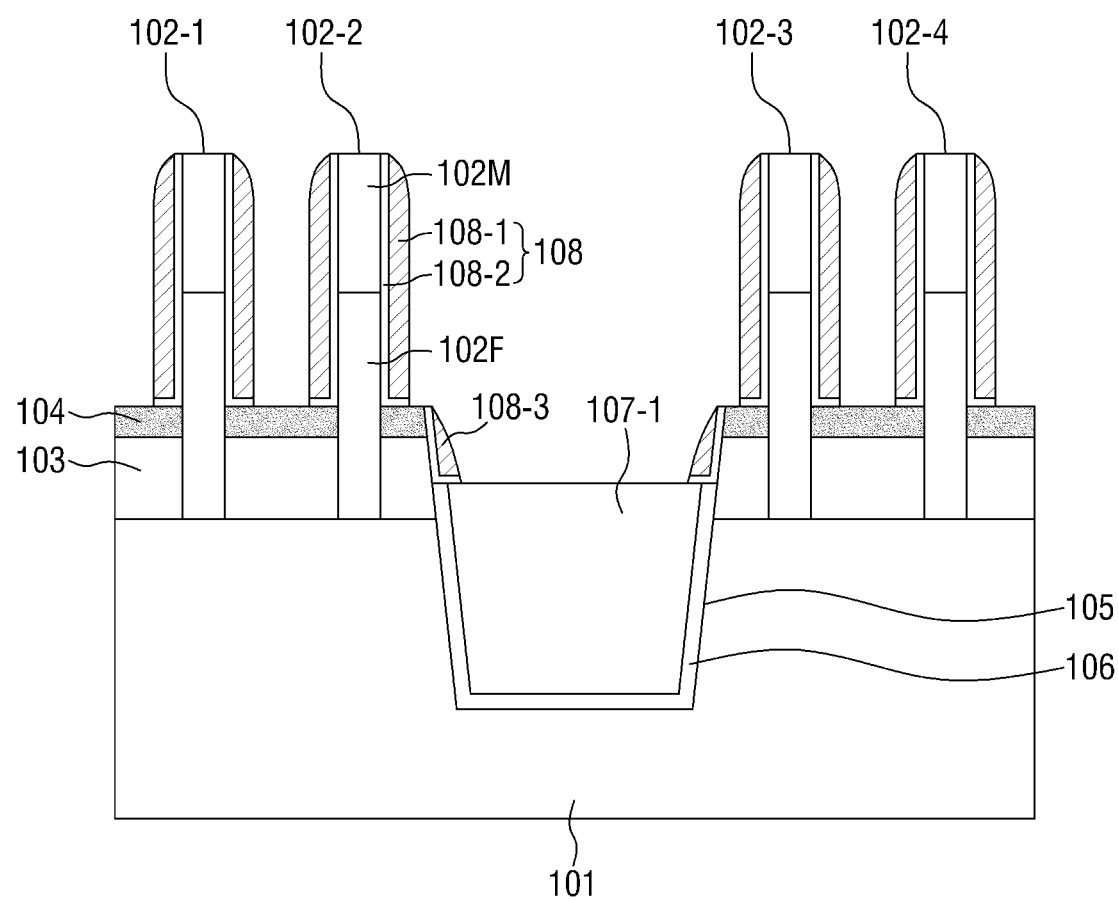

FIG. 1I shows that the gate structure 108 deposited in the process of FIG. 1H is etched by a method such as dry etching, not being limited thereto, to open a top surface of the fin structures 102-1 through 102-4, the top surface of the bottom spacer 104 between the fin structures 102-1 through 102-4, and the top surface of the STI structure 107-1 disposed in the shallow trench 105, thereby to form a VFET device structure.

Here, it is noted that, because the STI dielectric 107 is over-recessed at the shallow trench 105 in the process of FIG. 1G, when the gate structure 108 is formed and etched in the processes of FIGS. 1H and 1I, a residue 108-3 of the gate structure 108 may remain at the side surfaces of the bottom spacer 104 and the portions of the side surfaces of the doped layer 103 forming the shallow trench 105. Since this residue 108-3 of the gate structure 108 contacts or disposed very close to the doped layer 103, a short circuit may be generated between the residue 108-3 of the gate structure 108 and a bottom S/D region formed at the side surfaces of the doped layer 103, which may increase unnecessary capacitance to reduce AC performance of a VFET device formed from the VFET device structure 100 and adversely affect productivity of the VFET device.

Accordingly, a more improved method of manufacturing a VFET device structure is considered hereblow.

FIGS. 2A through 2L illustrate cross-sectional side views of a method of manufacturing a VFET device, according to an embodiment.

The processes performed in the present embodiment as shown in FIGS. 2A through 2F are the same or similar to the processes performed in the previous embodiment shown in FIGS. 1A through 1F. Thus, an intermediate VFET device structure 200 according to the present embodiment includes a substrate 201, a plurality of fin structures 202-1 through 202-4 each of which includes a fin 202F and a mask 202M, a doped layer 203, a bottom spacer 204, a shallow trench 205, a dielectric layer 206, and an STI dielectric 207 which is an insulating material, although duplicate descriptions about the processes are omitted.

Figure 2A:
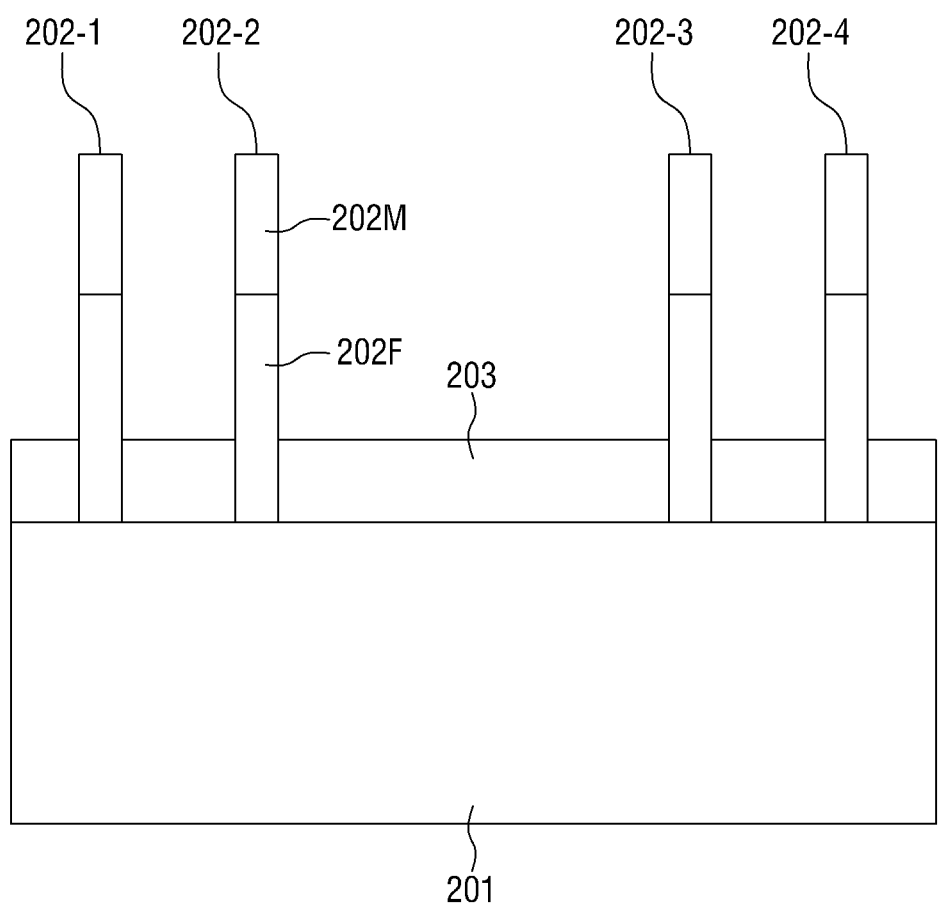
FIGS. 2A through 2L illustrate cross-sectional side views of a method of manufacturing a VFET device, according to an embodiment.
Figure 2B:
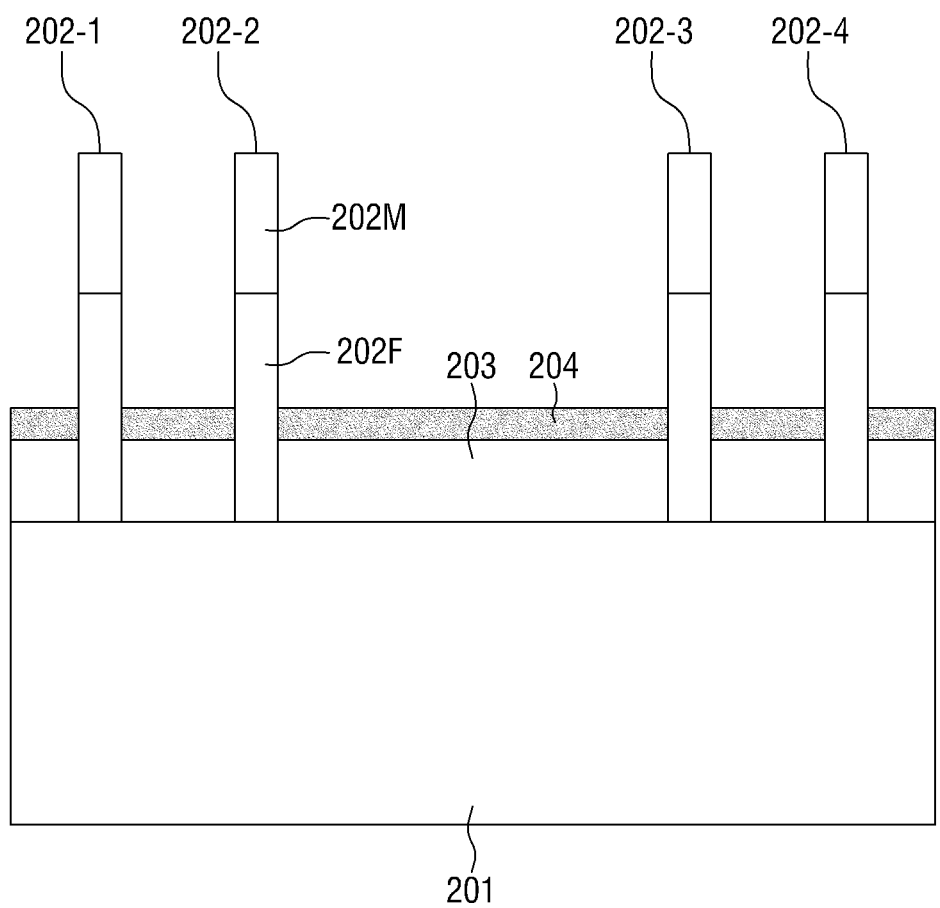
Figure 2C:
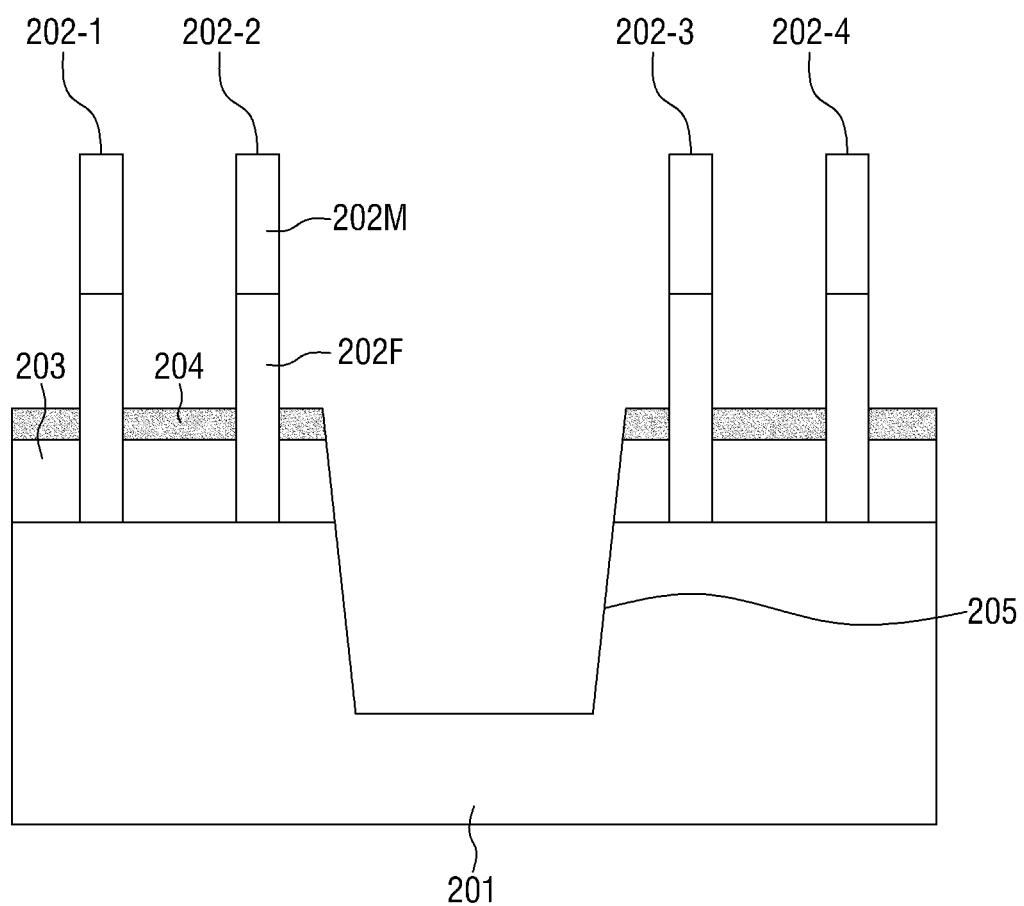
Figure 2D:
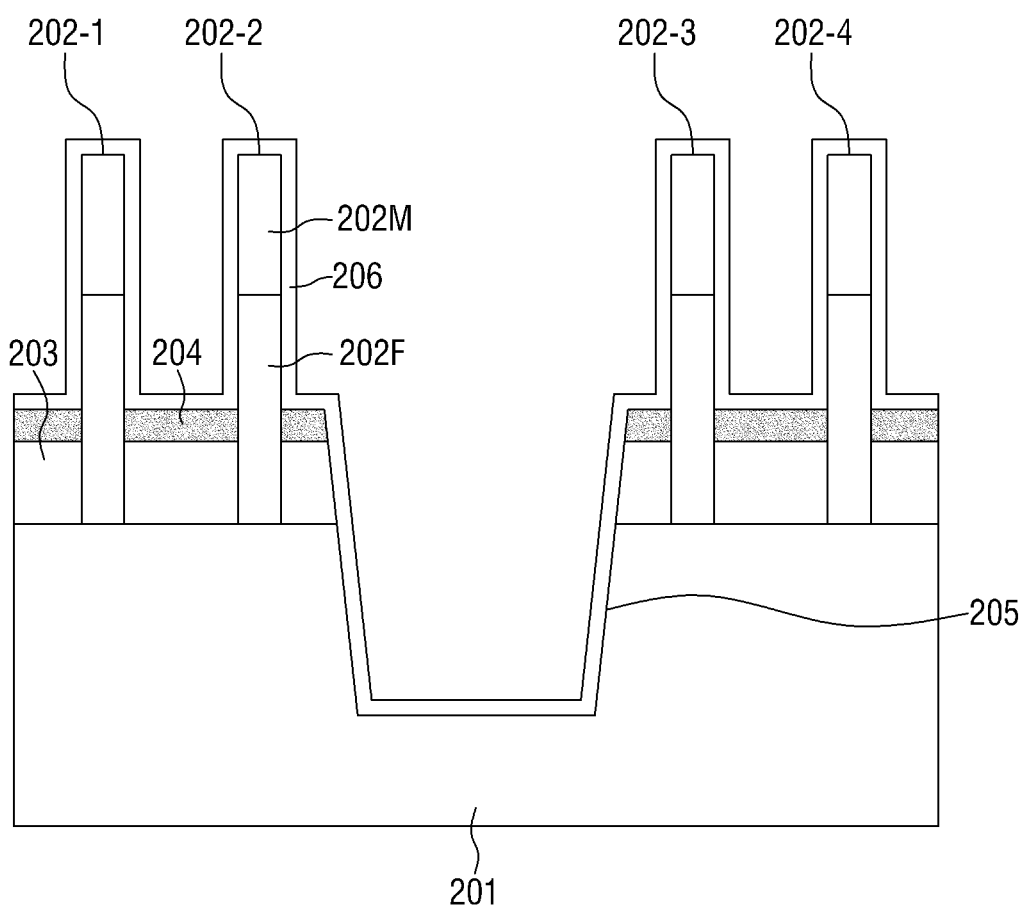
Figure 2E:
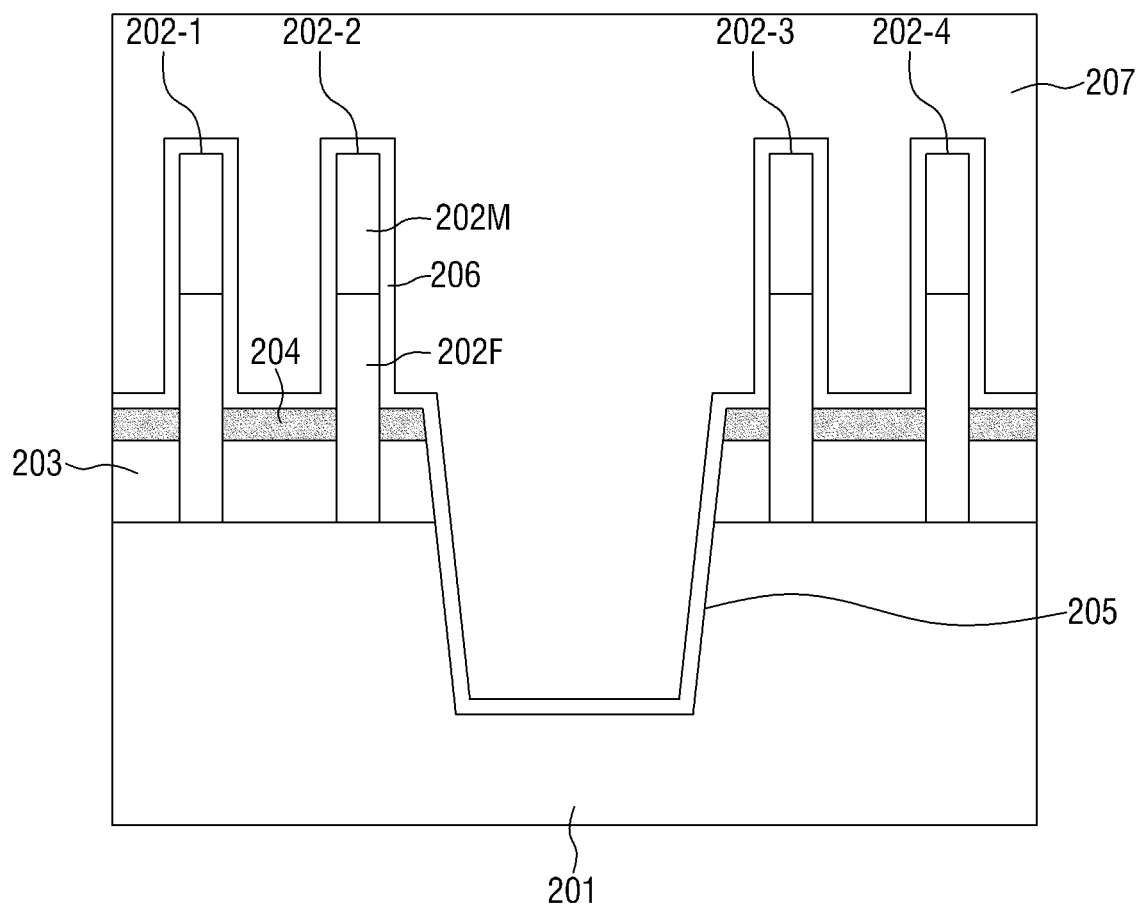
Figure 2F:
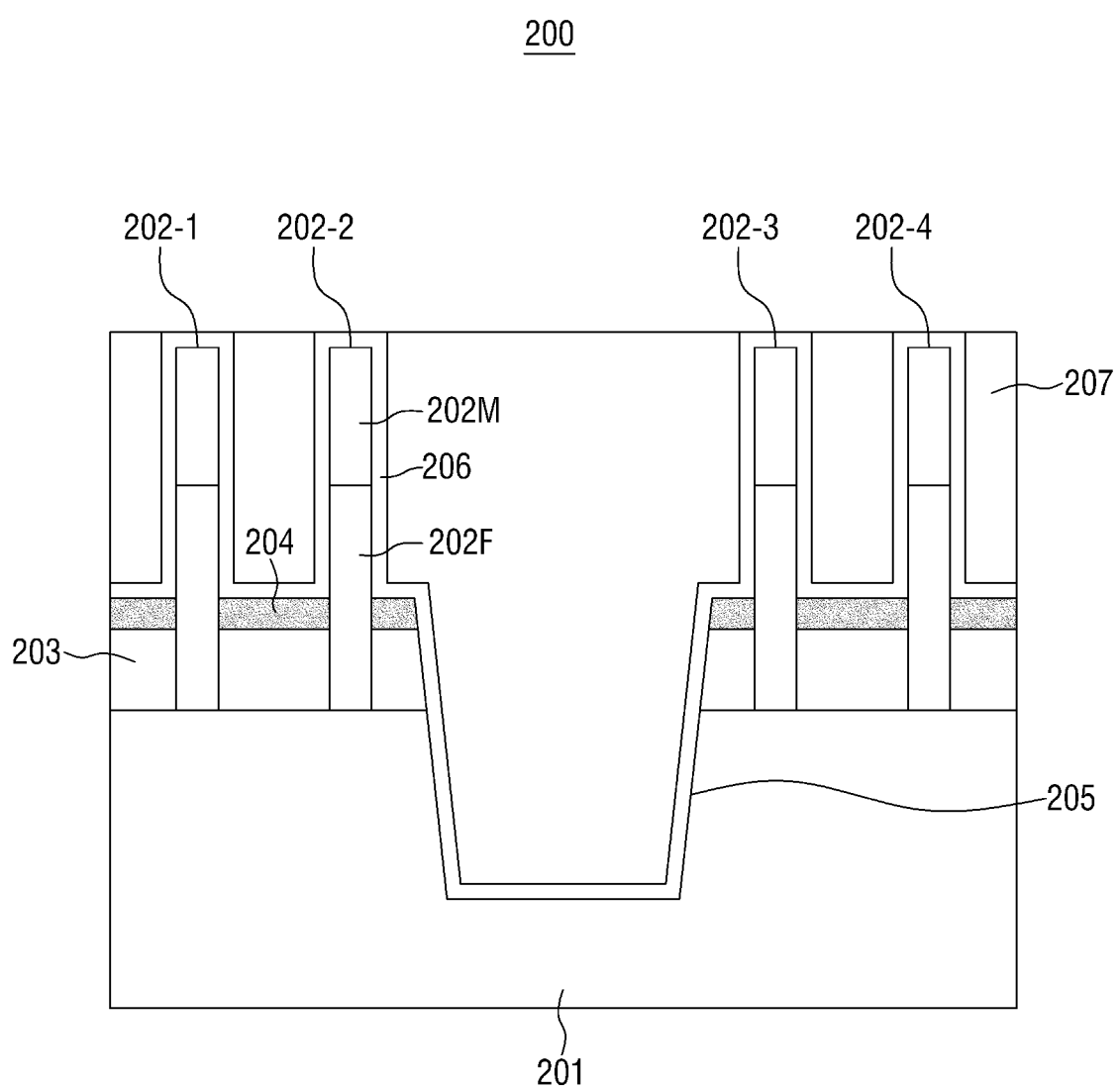
Figure 2G:
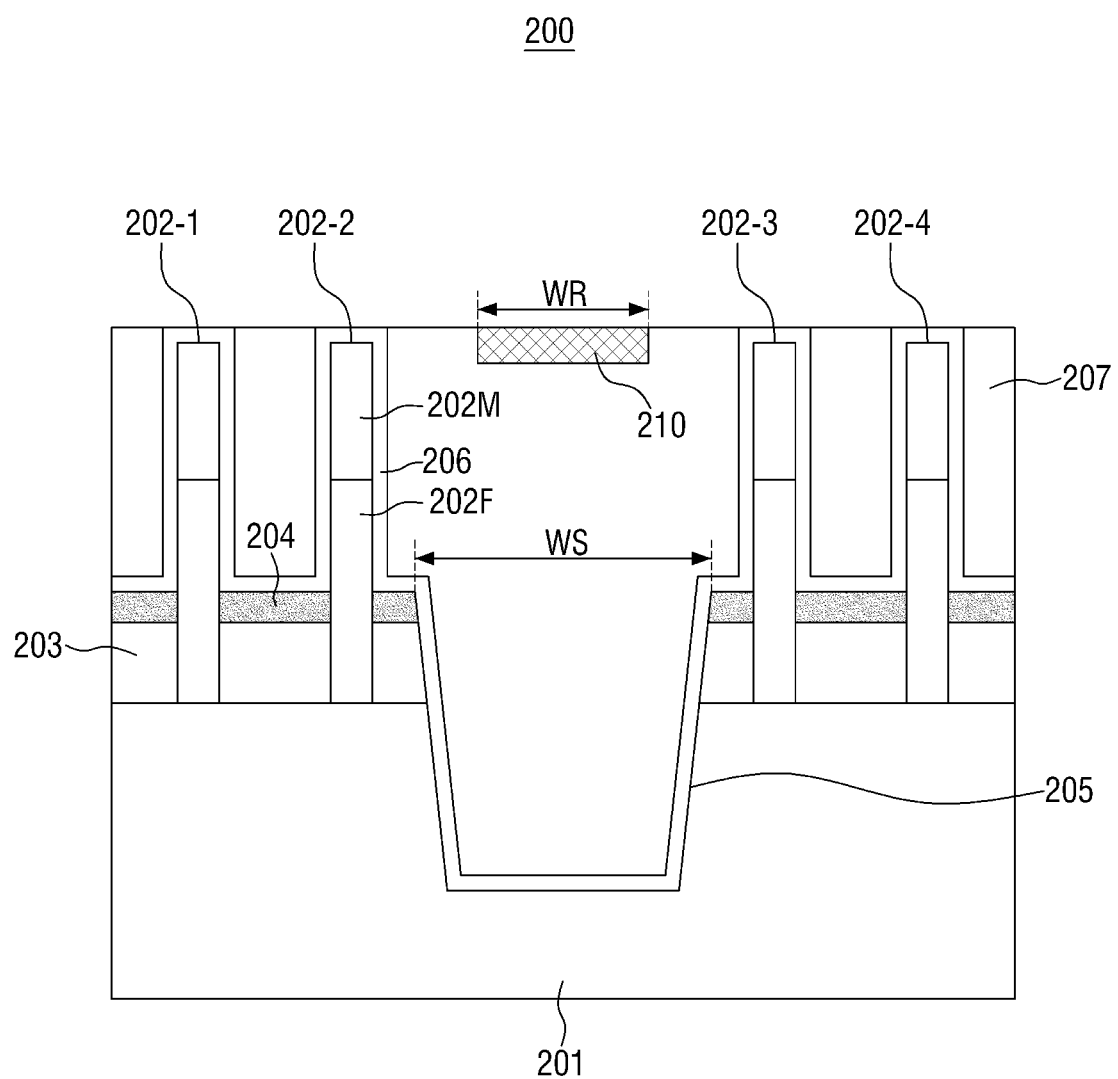

FIG. 2G shows that, after the STI dielectric 207 is planarized in the process of FIG. 2F like in FIG. 1F, a recess delay structure 210 is inserted in the planarized STI dielectric 207, preferably but not necessarily, right below a top surface thereof at a position overlapping the shallow trench 205. The recess delay structure 210 may be formed of a material such as SiN, not being limited thereto, having etch selectivity against the STI dielectric 207 formed of a dielectric oxide material. A width WR of the recess delay structure 210 may be the same as or slightly smaller than a width WS of the shallow trench 205. However, the inventive concept is not limited thereto. Thus, this recess delay structure 210 may be able to delay etching of the planarized STI dielectric 207 at a position above the shallow trench 205 as will be described in reference to FIG. 2H below.

Referring to FIG. 2G, the recess delay structure 210 is shown as being inserted in the STI dielectric 207 after the STI dielectric 207 is deposited and planarized. However, the inventive concept is not limited thereto because the recess delay structure 210 may be inserted in the STI dielectric 207 before the STI dielectric 207 is planarized according to an embodiment. For example, after patterning the STI dielectric 207 shown in FIG. 2E to secure an area where the recess delay structure 210 is to be inserted, the STI dielectric 207 is dry-etched to form a recess therein and the recess delay structure 210 is deposited before the STI dielectric 207 including the recess delay structure 210 is planarized by CMP.

Figure 2H:
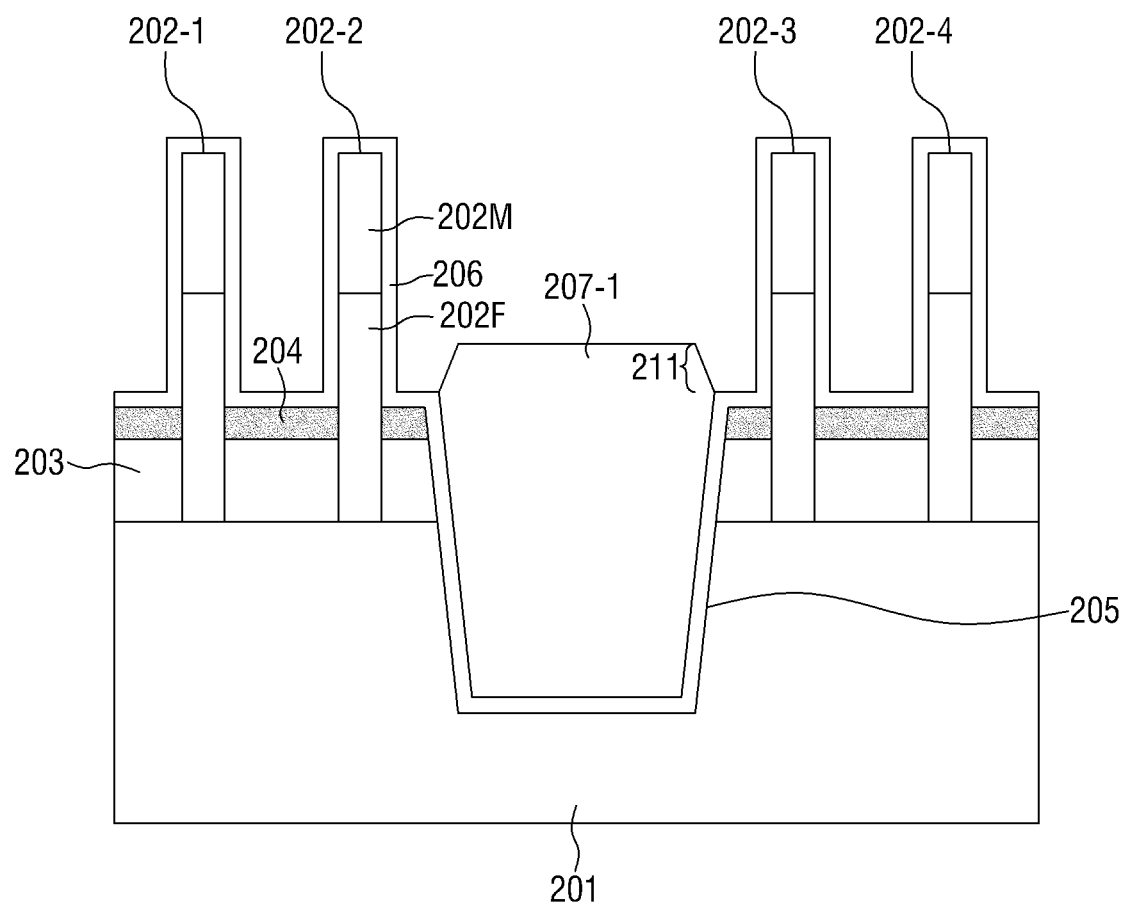

FIG. 2H shows that the planarized STI dielectric 207 is etched by dry etching or wet etching, not being limited thereto, to reveal the fin structures 202-1 through 202-4 on which the dielectric layer 206 is lined and form an STI structure 207-1. By this etching process, the planarized STI dielectric 207 filled between the fin structures 202-1 through 202-4, except at a position of the shallow trench 205, above a level of a top surface of the doped layer 203, specifically, above the level of a top surface of the bottom spacer 204, is completely removed in order to later form a gate structure on the fin structures 202-1 through 202-4.

It is noted here that, due to the recess delay structure 210 inserted in the STI dielectric 207 in the process of FIG. 2G, a portion of the STI dielectric 207 at or near a position where the recess delay structure 210 is inserted above the shallow trench 205 may be delay-etched compared to the other portion of the STI dielectric 207, thereby preventing over-recess of the STI dielectric 207 at a position above the shallow trench 205 that may occur in the etching process of FIG. 1G. Instead, the STI structure 207-1 formed through the etching in this process may have a protrusion 211 protruding at the shallow trench 205 between the fin structures 202-1 and 202-2 and the fin structures 202-3 and 202-4 above the level of the top surface of the bottom spacer 204. The protrusion 211 of the STI structure 207-1 may take a trapezoid shape above the level of the top surface of the bottom spacer 204, not being limited thereto. Here, a top surface and side surfaces of the protrusion 211 may be positioned above the level of the top surface of the bottom spacer 104 and below a level of a top surface of the fin 202F.

It is further noted from the process of FIG. 2H that, although FIG. 2G shows that the recess delay structure 210 is inserted in the planarized STI dielectric 207 right below the top surface thereof, the recess delay structure 210 may be inserted below the top surface of the planarized STI dielectric 207 by a certain distance as long as the recess delay structure 210 is able to delay the etching of the planarized STI dielectric 207 so that the protrusion 211 can be formed at the shallow trench 205 between the fin structures 202-1 and 202-2 and the fin structures 202-3 and 202-4 above the level of the top surface of the bottom spacer 204.

FIG. 2H further shows that, even after the etching of the planarized STI dielectric 207, the dielectric layer 206 still remains on outer surfaces of the fin structures 202-1 through 202-4, and the top surface of the bottom spacer 204 between the fin structures 202-1 through 202-4 because the dielectric layer 206 is formed of the material such as SiN having etch selectivity against a material forming the STI dielectric 207 such as SiO or $SiO_2$. However, the STI structure 207-1, particularly the protrusion 211 thereof, formed through the etching process of FIG. 2H does not have the dielectric layer 206 thereon.

Figure 2I:
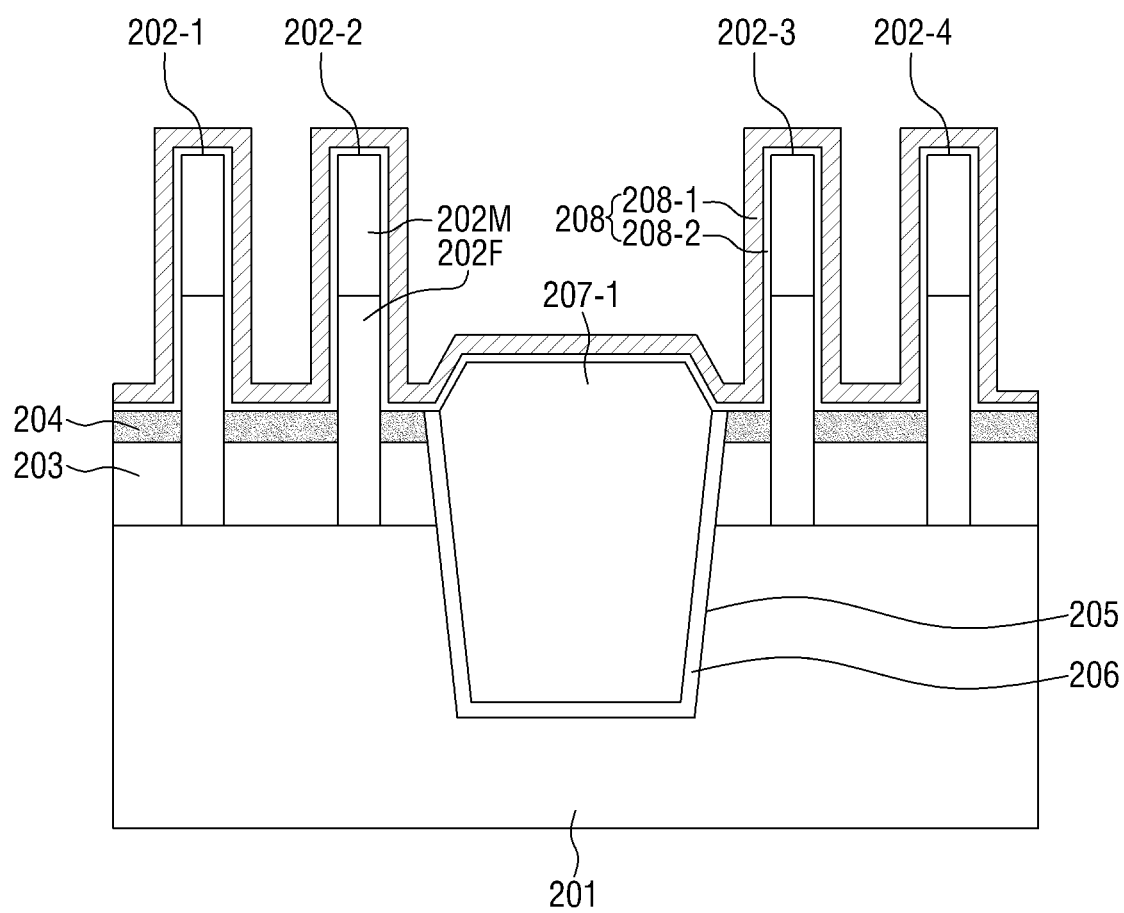

FIG. 2I shows that, after the dielectric layer 206 is stripped out (not shown) from the outer surfaces of the fin structures 202-1 through 202-4 and the top surface of the bottom spacer 204 between the fin structures 202-1 through 202-4, a gate structure 208 is deposited thereon and on the protrusion 211 of the STI structure 207-1. Here, as described in reference to FIG. 1H, the deposition of the gate structure 208 may be performed by a method such as ALD not being limited thereto, and the gate structure 208 may include a conductor layer 208-1 formed of a metal or metal compound such as Cu, Al, Ti, Ta, W, Co, TiN, WN, TiAl, TiAlN, TaN, TiC, TaC, TiAlC, TaCN, TaSiN, or a combination thereof, not being limited thereto, and a high-κ layer 208-2 formed of a metal oxide material or a metal silicate such as Hf, Al, Zr, La, Mg, Ba, Ti, Pb, or a combination thereof, not being limited thereto.

Figure 2J:
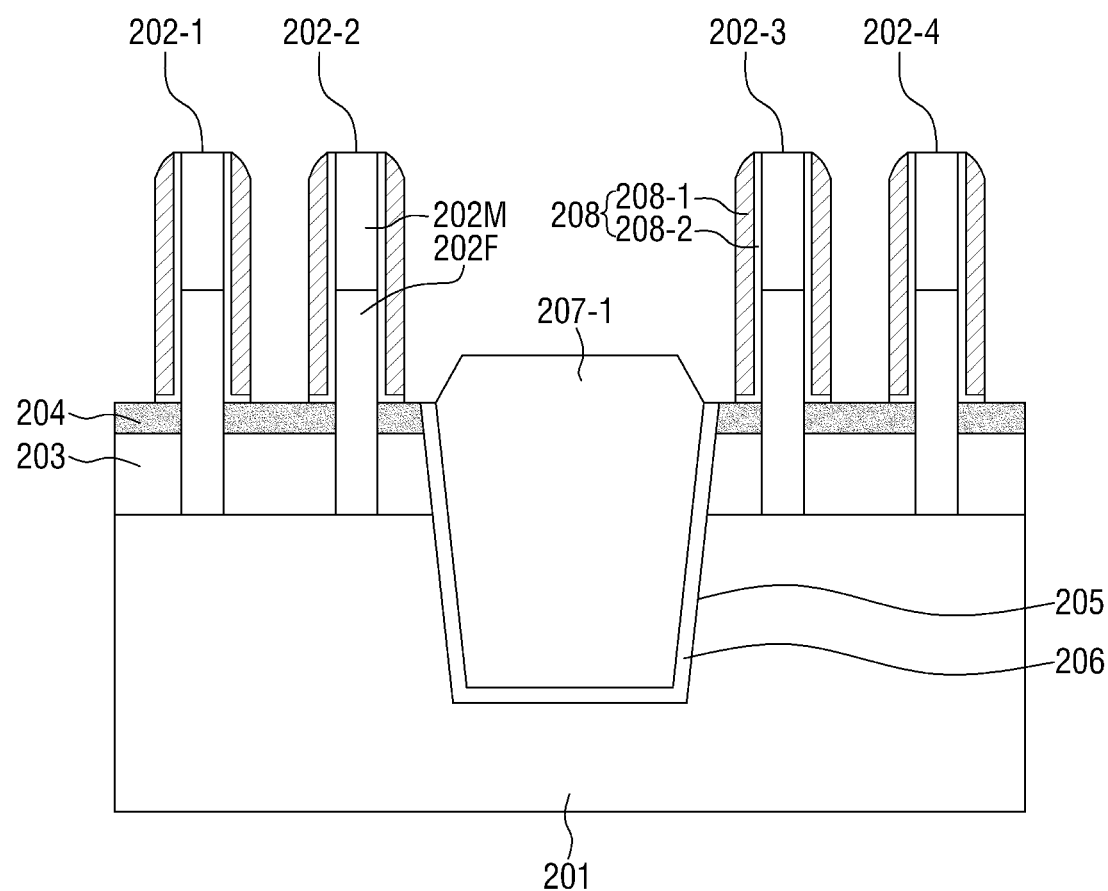

FIG. 2J shows that the gate structure 208 deposited in the process of FIG. 2I is etched by a method such as dry etching, not being limited thereto, to open top surfaces of the fin structures 202-1 through 202-4, the top surface of the bottom spacer 204 between the fin structures 202-1 through 202-4, and the protrusion 211 of the STI structure 207-1, thereby to form a VFET device structure corresponding to the VFET device structure shown in FIG. 1I.

Here, it is noted that, unlike the processes of FIGS. 1H and 1I, when the gate structure 208 is formed and etched in the processes of FIGS. 2I and 2J, a residue of the gate structure 208 may not remain at the side surfaces of the bottom spacer 204 and portions of the side surfaces of the doped layer 203 forming the shallow trench 205. This is because the recess delay structure 210 is inserted in the STI dielectric 207 to delay the etching of the STI dielectric 207 in the process of FIG. 2H at a position of the shallow trench 205, thereby forming the STI structure 207-1 having the protrusion 211 to prevent formation of such residue of the gate structure 208. Thus, there may not be generated a short circuit between the residue of the gate structure 208 and a bottom S/D region formed at the side surfaces of the doped layer 203 as in the process of FIG. 1I. Accordingly, the method of manufacturing a VFET device structure according to the present embodiment may prevent increase of unnecessary capacitance reducing AC performance of a VFET device formed from the intermediate VFET device structure 100 and productivity degradation of the VFET device.

It is further noted that, to be consistent with the inventive concept, a different process other than the etching process of FIGS. 2G through 2J using the delay recess structure 210 may be used as long as the etching of the STI dielectric 207 at the position above the shallow trench 205 can be delayed to prevent the residue of the gate structure 208 from remaining at the side surfaces of the bottom spacer 204 and portions of the side surfaces of the doped layer 203 forming the shallow trench 205. In addition, although the delayed etching according to the present embodiment generates the STI structure 207-1 having the protrusion 211 above the level of the top surfaces of the doped layer 203 and the bottom spacer 204 to prevent formation of the residue of the gate structure 208 in the shallow trench 205, the inventive concept is not limited thereto. According to an embodiment, the delayed etching may be controlled such that the top surface of the STI structure 207-1 is formed not to be below the level of the top surface of the doped layer 203 or the top surface of the bottom spacer 204 as long as the delayed etching can prevent formation of the residue of the gate structure 208 in the shallow trench 205 as shown in FIG. 1G.

Figure 2K:
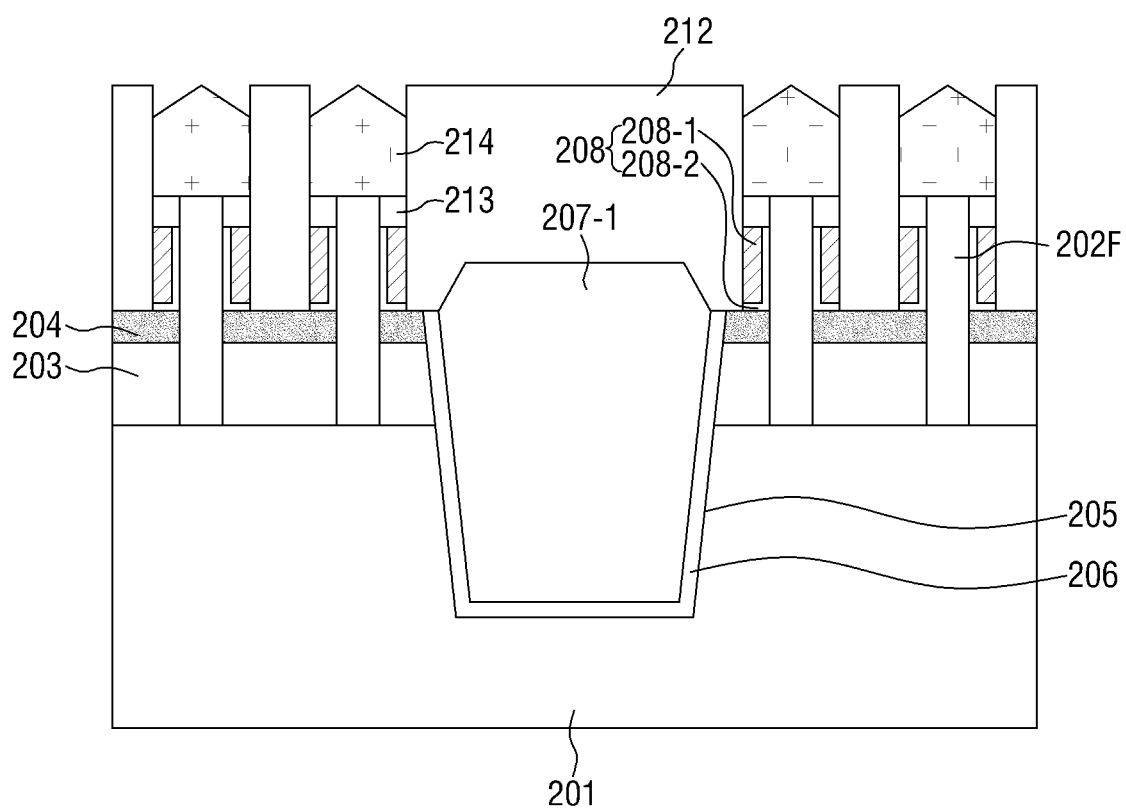
Figure 2L:
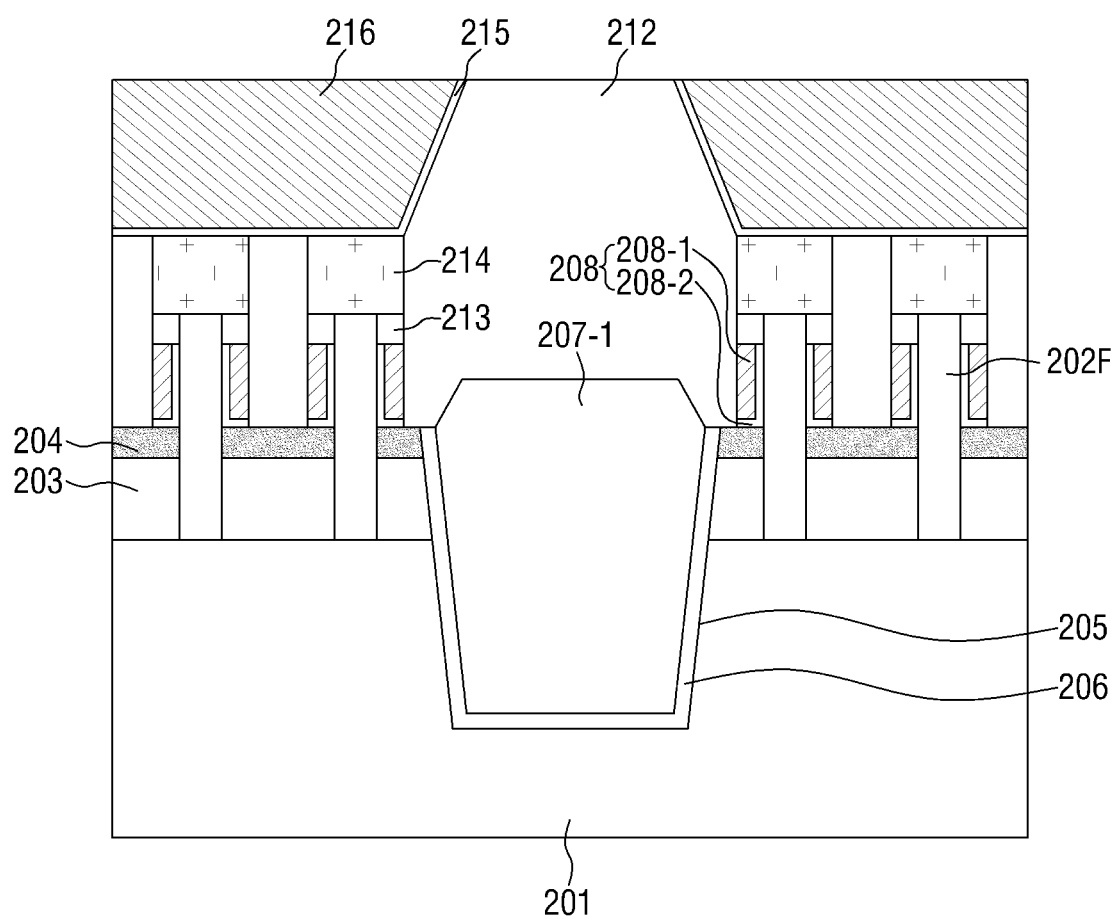

FIGS. 2K and 2L show that, after the fin structures 202-1 through 202-4 on which the gate structure 208 is deposited and etched in FIGS. 2I and 2J, the VFET device structure is planarized and/or etched again at least to remove the masks 202M from the fin structures 202-1 through 202-4, and further, an interlayer dielectric (ILD) layer 212, a top spacer 213, and a top S/D region 214 and are deposited or formed, and further, a contact liner 215 and a contact structure 216 are formed on the top S/D region 214, thereby to form a desired VFET device. Here, the ILD layer 212 formed of a material including nitride, oxide, or a combination thereof, not being limited thereto may be deposited between the fin structures 202-1 through 202-4. The top spacer 213 formed of a material similar to or different from that of the bottom spacer 204 may be deposited above the gate structure 208 to serve to electrically isolate the gate structure 208 from the top S/D region 214. The top S/D region 214 may also be formed by epitaxially growing a semiconductor layer on the fin structures 202-1 through 202-4 from which the masks 202M are removed, and doping impurities therein.

FIGS. 3A through 3L illustrate cross-sectional side views of a method of manufacturing a VFET device, according to an embodiment.

The processes performed in the present embodiment differs from the previous embodiment as shown in FIGS. 2A through 2L in that a process of forming a bottom spacer on a doped layer is performed after an STI dielectric is formed and etched in an interim VFET device structure, while, in the previous embodiment, the process of forming the bottom spacer on the doped layer is performed before the STI dielectric is formed and etched in the interim VFET device structure, as described in detail below.

Figure 3A:
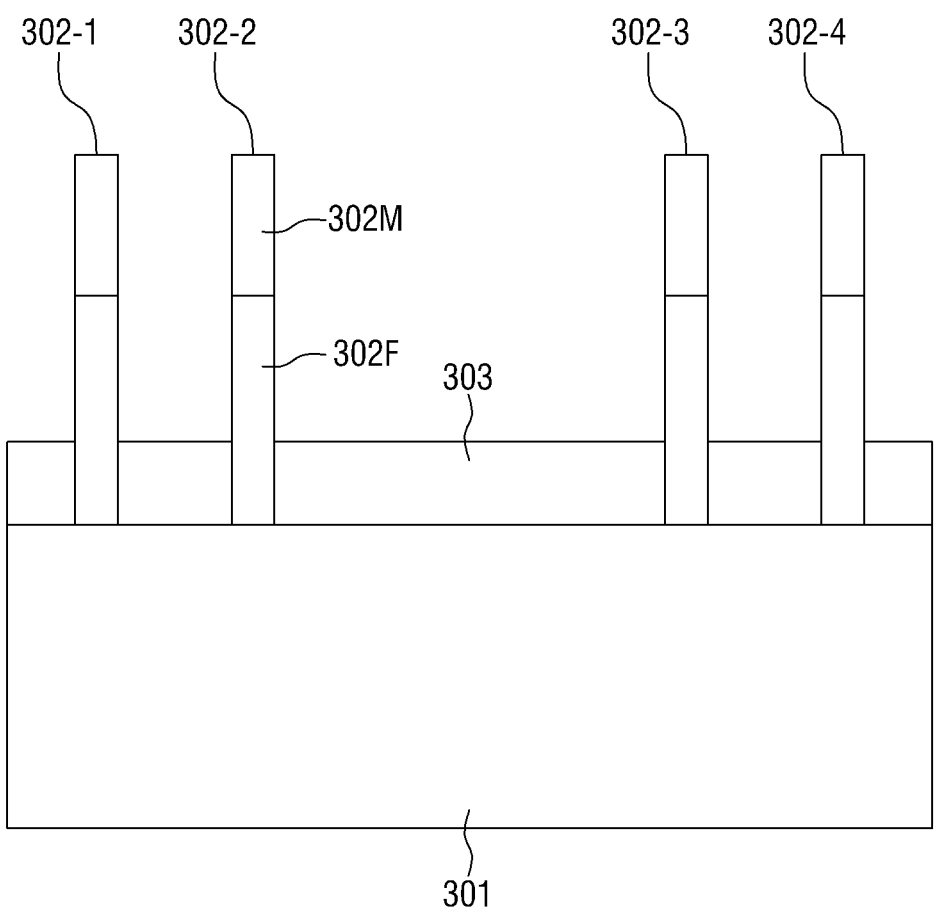
FIGS. 3A through 3L illustrate cross-sectional side views of a method of manufacturing a VFET device, according to an embodiment.

FIG. 3A shows an intermediate VFET device structure 300, in which a substrate 301 is provided and a plurality of fin structures 302-1 through 302-4 are vertically formed thereon. Each of the fin structures 302-1 through 302-4 may include a fin 302F and a mask 302M formed thereon. However, depending on a choice of a manufacturing process, the mask 302M may not be included in the each of the fin structures 302-1 through 302-4. The fin structures 302-1 and 302-2 and the fin structures 302-3 and 302-4 are spaced apart so that VFETs formed around the fin structures 302-1 and 302-2 are isolated from VFETs formed around the fin structures 302-3 and 302-4 for design purposes of a VFET device to be constituted from the intermediate VFET device structure 300.

Figure 3B:
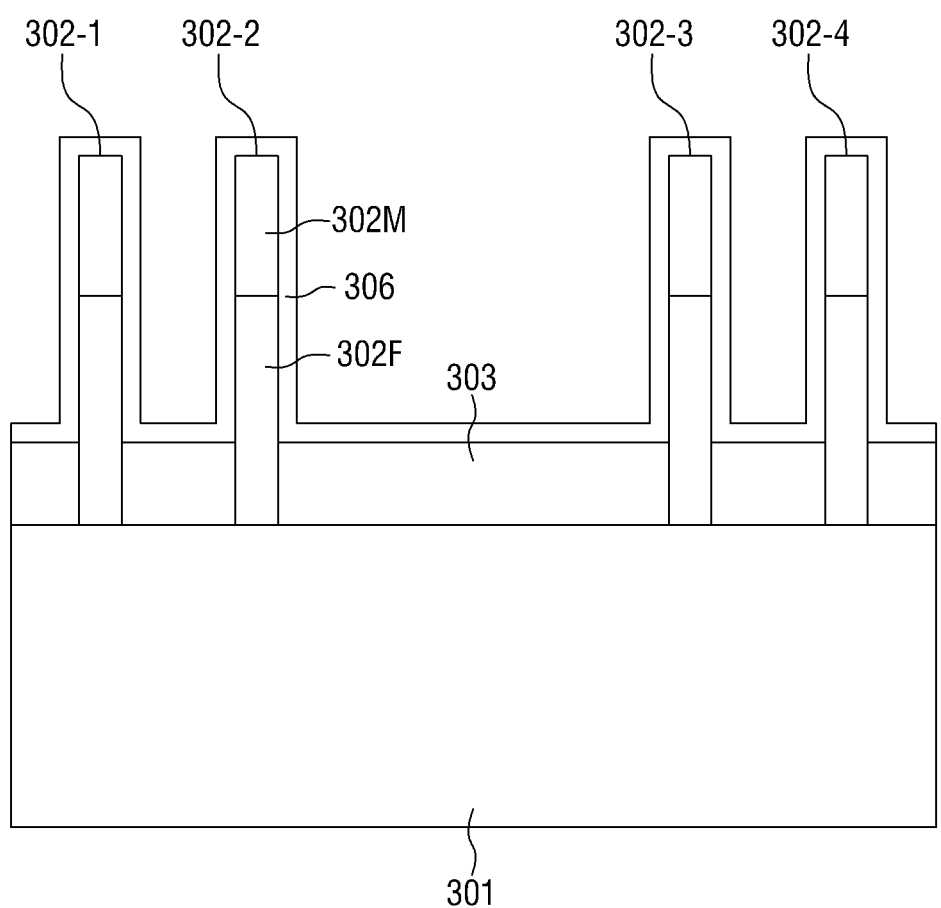

FIG. 3B shows that a dielectric layer 306 including a material such as SiN is lined or deposited by a method such as ALD, not being limited thereto, along outer surfaces of the fin structures 302-1 through 302-4 and a top surface of the doped layer 303 between the fin structures 302-1 through 302-4, to prevent damages such as oxidation of these elements from a follow-on STI process which uses an oxide material.

Figure 3C:
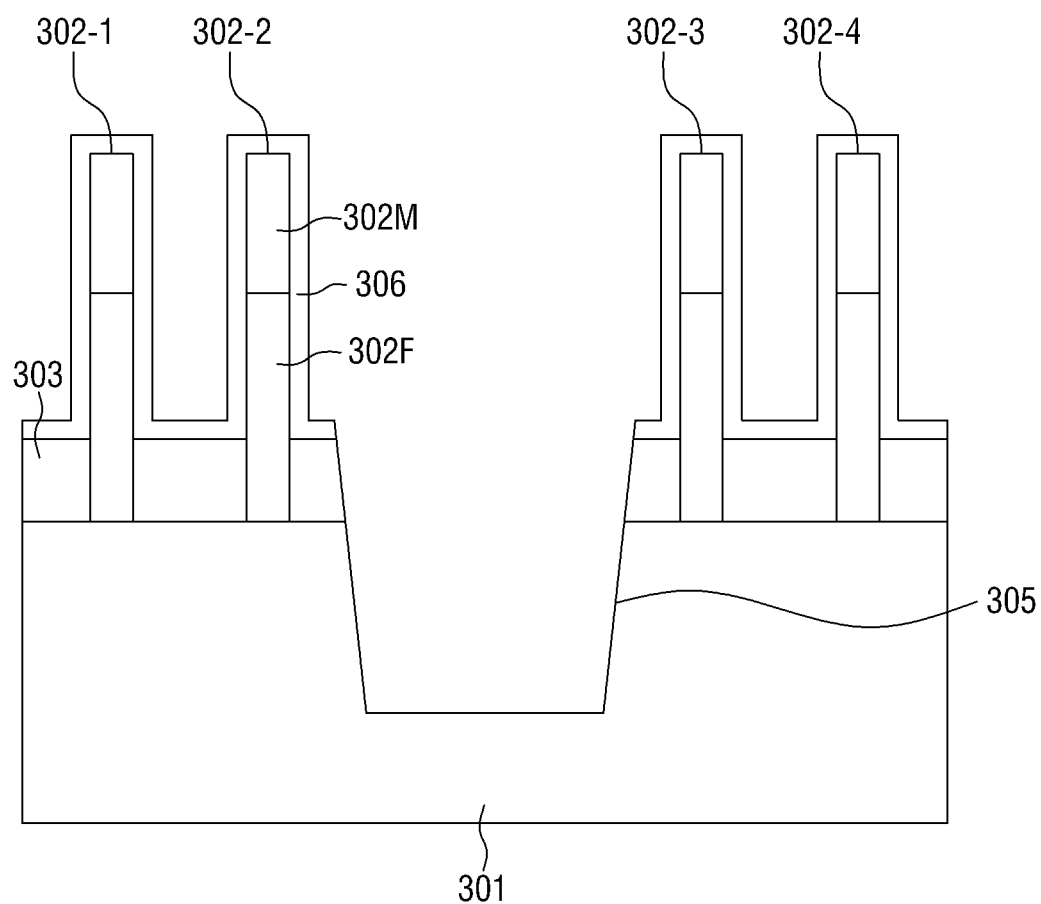

FIG. 3C shows that a shallow trench 305 is etched from the doped layer 303, on which the dielectric layer 306 is lined, into the substrate 301 to provide a space for the STI to be processed later. The method used for the etching in this process may be dry etching, not being limited thereto.

Figure 3D:
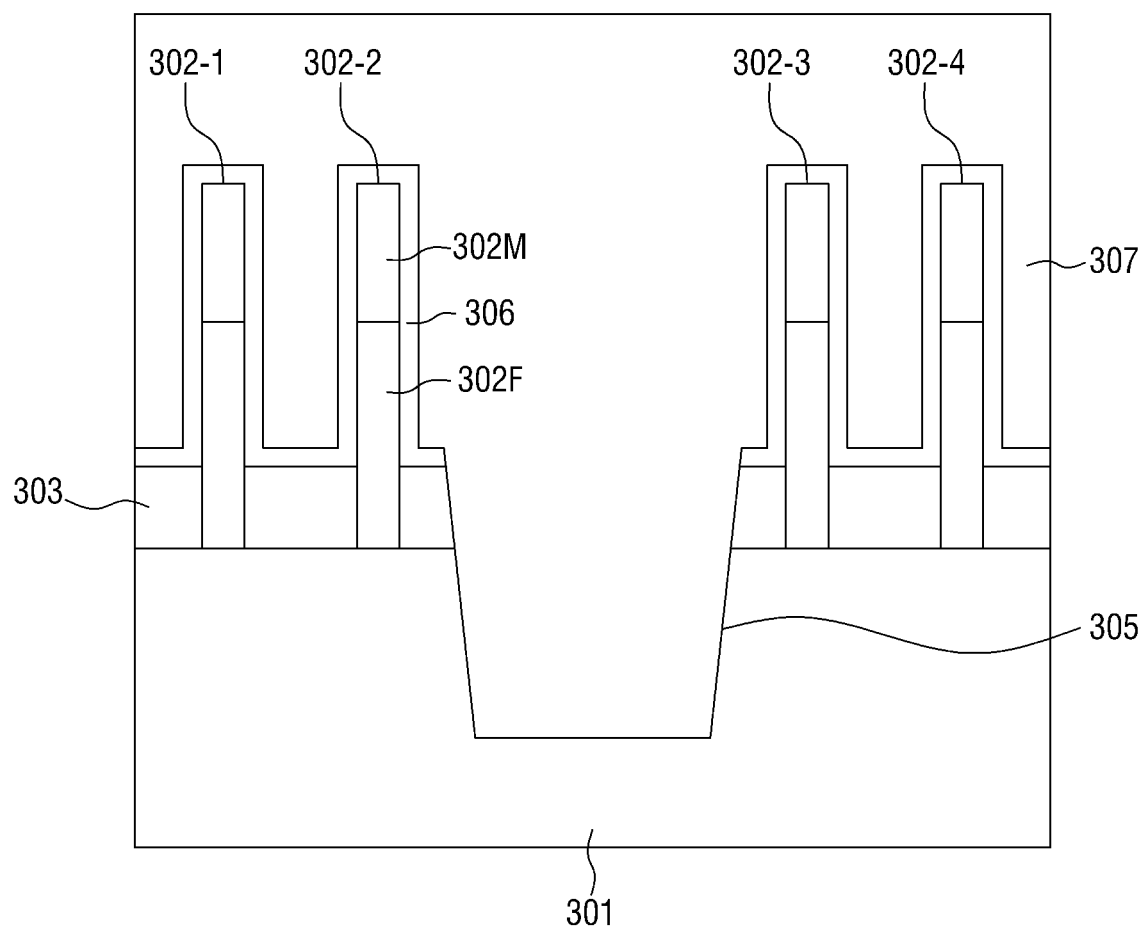

FIG. 3D shows that an STI dielectric 307, which is an insulating material, is deposited, by a method such as CVD or floating vapor CVD, not being limited thereto, on the dielectric layer 306 covering the outer surfaces of the fin structures 302-1 through 302-4 and a top surface of the doped layer 303 between the fin structures 302-1 through 302-4, and in the shallow trench 305, to completely fill the space between the fin structures 302-1 through 302-4 as well as the shallow trench 305. The STI dielectric 307 used in this deposition process may be formed of a material such as SiO or $SiO_2$, not being limited thereto, having etch selectively over the dielectric layer 306.

Figure 3E:
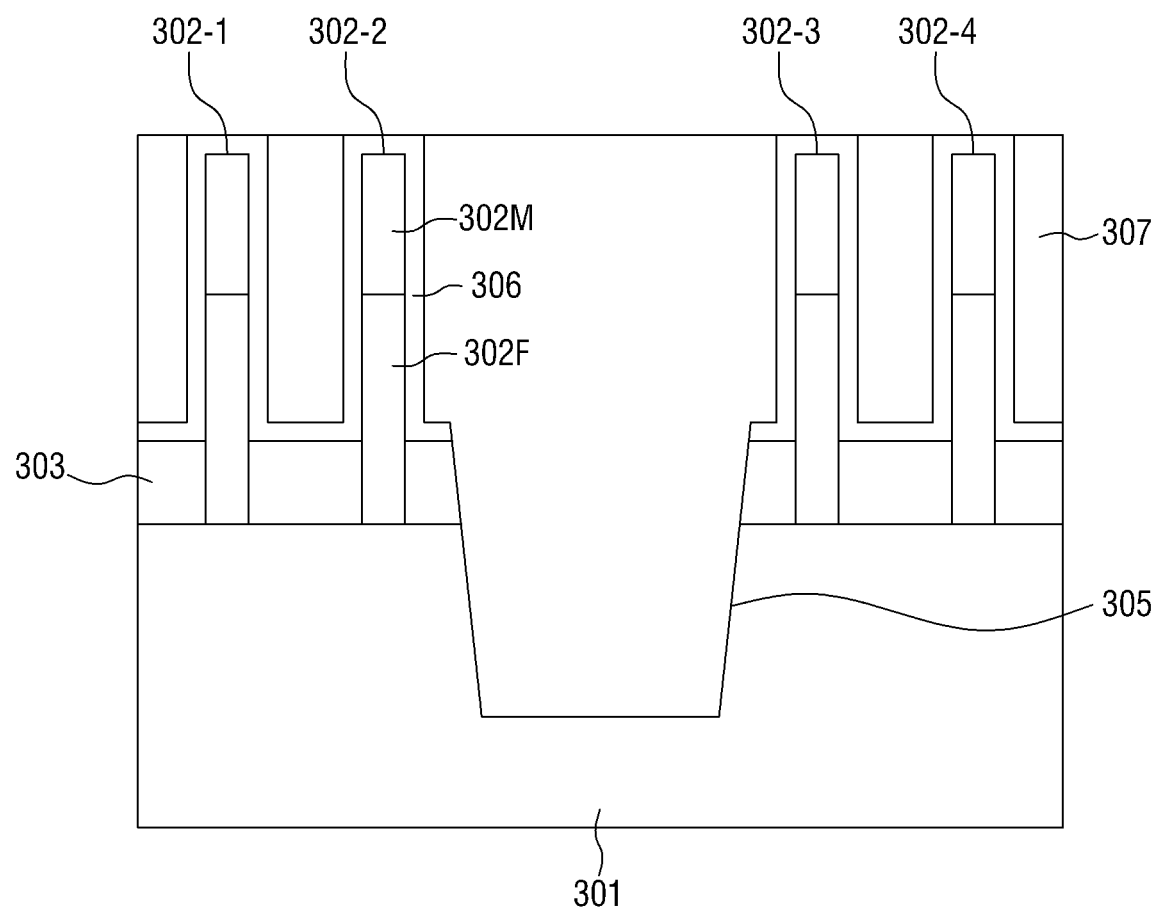

FIG. 3E shows that the STI dielectric 307 is planarized (or polished) by a method such as CMP, not being limited thereto, so that a top surface of the planarized STI dielectric 307 is coplanar with top surfaces of the fin structures 302-1 through 302-4, and the dielectric layer 306 lined on the top surfaces of the fin structures 302-1 through 302-4 are exposed.

Figure 3F:
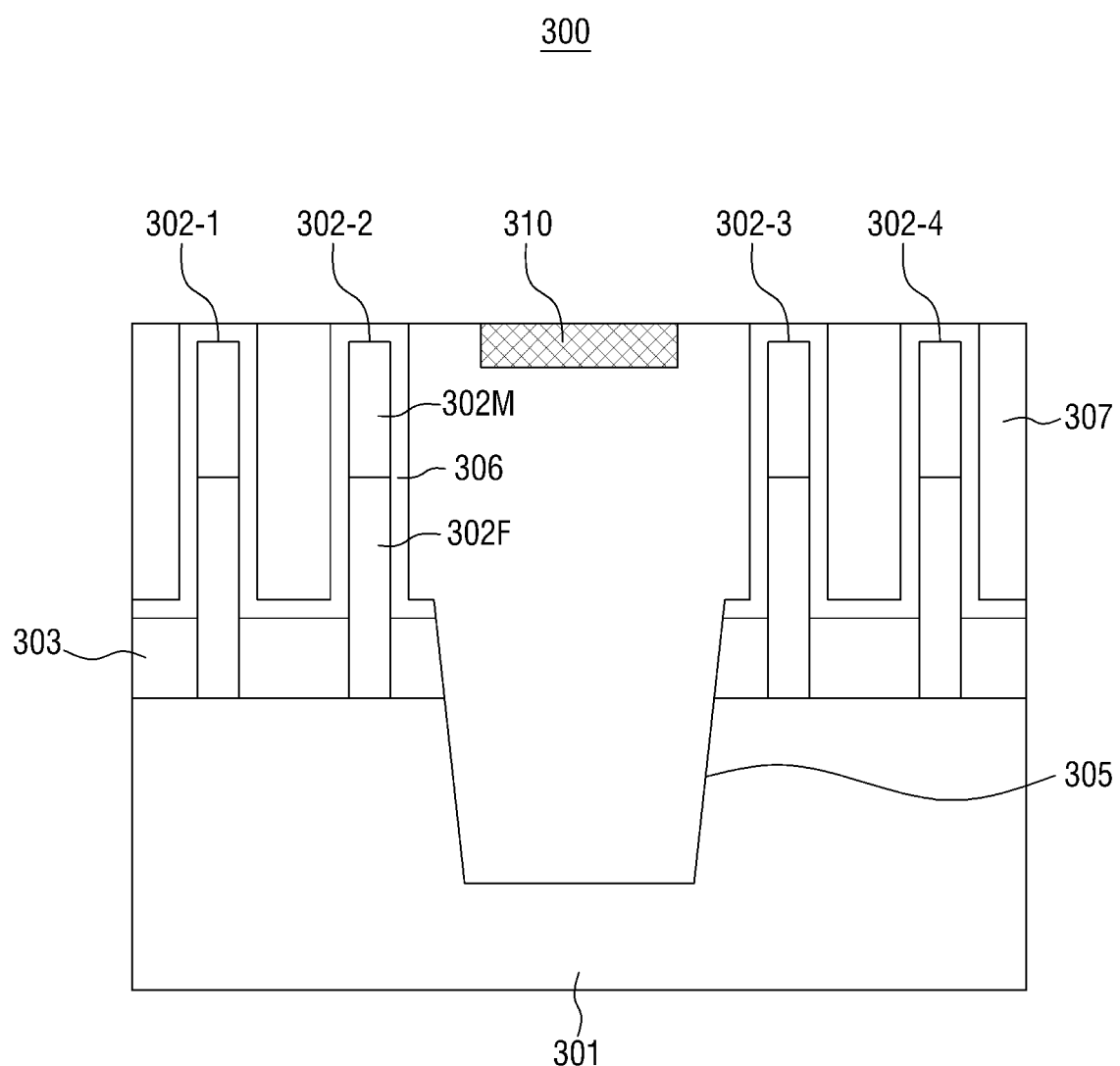

FIG. 3F shows that, after the STI dielectric 307 is planarized in the process of FIG. 3F, a recess delay structure 310 is inserted in the STI dielectric 307, preferably but not necessarily, right below a top surface thereof at a position overlapping the shallow trench 305. The recess delay structure 310 may be formed of a material such as SiN, not being limited thereto, having etch selectivity against the STI dielectric 307 formed of a dielectric oxide material. A width WR of the recess delay structure 310 may be the same as or slightly smaller than a width WS of the shallow trench 305. However, the inventive concept is not limited thereto. Thus, this recess delay structure 310 may be able to delay etching of the planarized STI dielectric 307 at a position above the shallow trench 305 as will be described in reference to FIG. 3G below.

Referring to FIG. 3F, the recess delay structure 310 is shown as being inserted in the STI dielectric 307 after the STI dielectric 307 is deposited and planarized. However, the inventive concept is not limited thereto because the recess delay structure 310 may be inserted in the STI dielectric 307 before the STI dielectric 307 is planarized according to an embodiment.

Figure 3G:
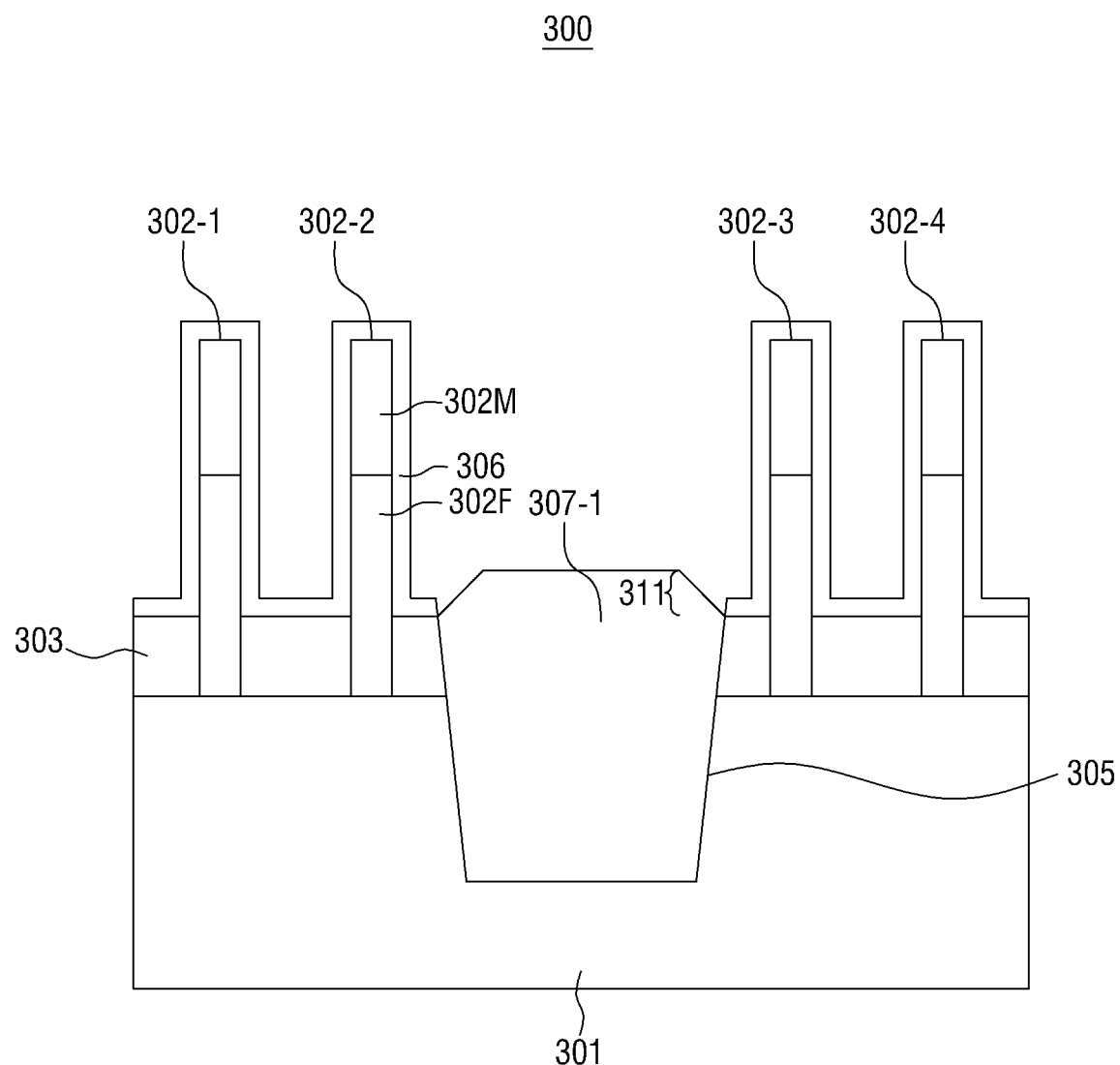

FIG. 3G shows that the planarized STI dielectric 307 is etched by dry etching or wet etching, not being limited thereto, to reveal the fin structures 302-1 through 302-4 on which the dielectric layer 306 is lined and form an STI structure 307-1. By this etching process, the planarized STI dielectric 307 filled between the fin structures 302-1 through 302-4, except at a position of the shallow trench 305, above a level of the top surface of the doped layer 303 is completely removed in order to later form a gate structure on the fin structures 302-1 through 302-4.

It is noted here that, due to the recess delay structure 310 inserted in the STI dielectric 307 in the process of FIG. 3F, a portion of the STI dielectric 307 at or near a position where the recess delay structure 310 is inserted above the shallow trench 305 may be delay-etched compared to the other portion of the STI dielectric 307, thereby preventing over-recess of the STI dielectric 307 at a position above the shallow trench 305 that may occur in the etching process of FIG. 3G. Instead, the STI structure 307-1 formed through the etching in this process may have a protrusion 311 protruding at the shallow trench 305 between the fin structures 302-1 and 302-2 and the fin structures 302-3 and 302-4 above the level of the top surface of the doped layer 303. The protrusion 311 of the STI structure 307-1 may take a trapezoid shape above the level of the top surface of the doped layer 303, not being limited thereto. Here, a top surface and side surfaces of the protrusion 311 may be positioned above the level of the top surface of the doped layer 303 and below a level of a top surface of the fin 302F.

It is further noted from the process of FIG. 3G that, although FIG. 3F shows that the recess delay structure 310 is inserted in the planarized STI dielectric 307 right below the top surface thereof, the recess delay structure 310 may be inserted below the top surface of the planarized STI dielectric 307 by a certain distance as long as the recess delay structure 310 is able to delay the etching of the planarized STI dielectric 307 so that the protrusion 311 can be formed at the shallow trench 305 between the fin structures 302-1 and 302-2 and the fin structures 302-3 and 302-4 above the level of the top surface of the doped layer 303.

FIG. 3G further shows that, even after the etching of the planarized STI dielectric 307, the dielectric layer 306 still remains on the outer surfaces of the fin structures 302-1 through 302-4, and the top surface of the doped layer 303 between the fin structures 302-1 through 302-4 because the dielectric layer 306 is formed of the material such as SiN having etch selectivity against the material forming the STI dielectric 307 such as SiO or $SiO_2$. However, the STI structure 307-1, particularly the protrusion 311 thereof, formed through the etching process of FIG. 3G does not have the dielectric layer 306 thereon.

Figure 3H:
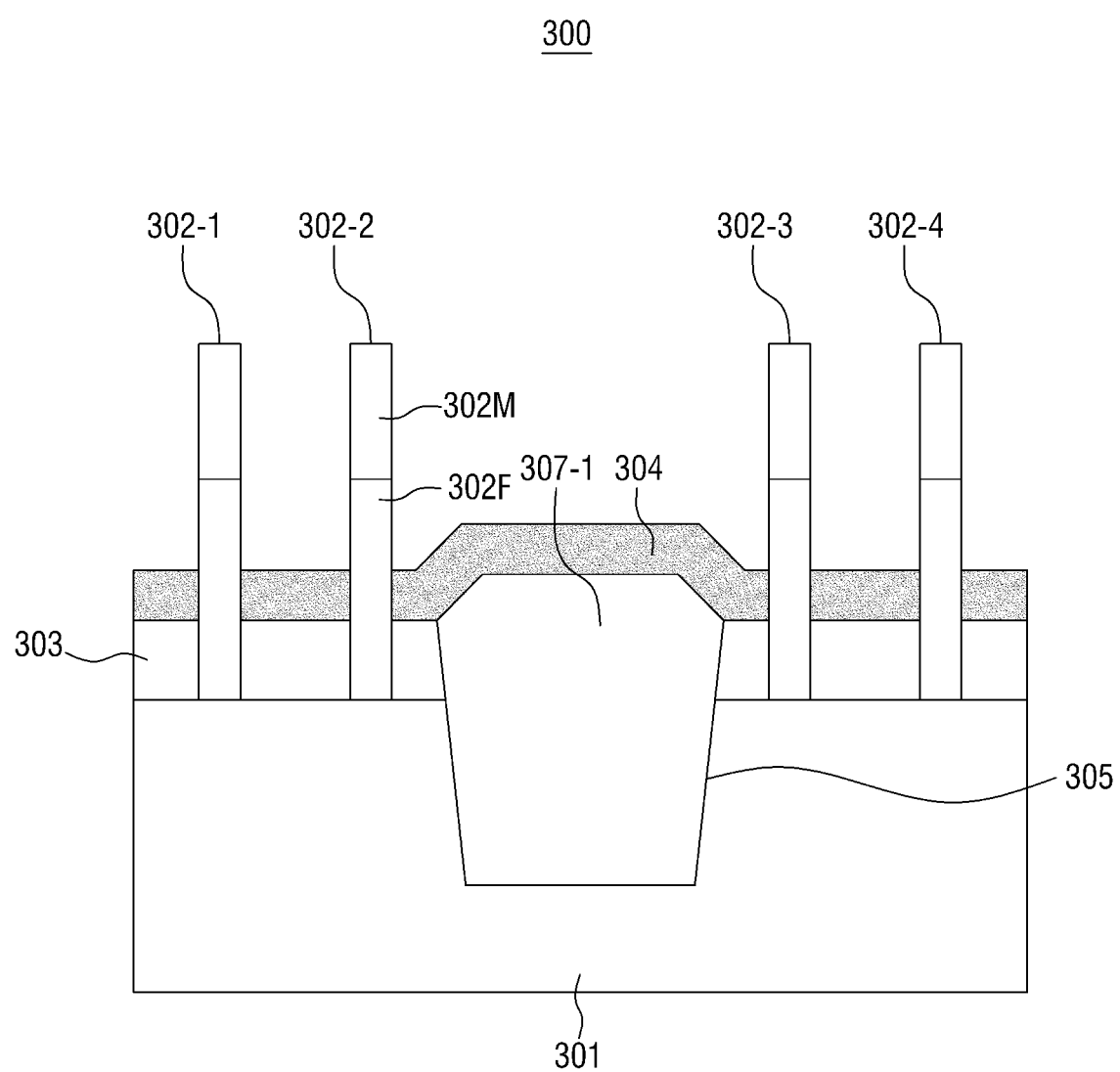

FIG. 3H shows that, after the dielectric layer 306 is stripped out (not shown) from the outer surfaces of the fin structures 302-1 through 302-4 and the top surface of the doped layer 303 between the fin structures 302-1 through 302-4, a bottom spacer 304 is deposited on the top surface of the doped layer 303 between the fin structures 302-1 through 302-4 and on the protrusion 311 of the STI structure 307-1 to insulate the doped layer 303 from neighboring elements such as a gate structure to be discussed later. The bottom spacer 304 may include a low-κ dielectric material such as SiO, SiN, SiON, SiCN, SiON, SiBCN, SiOCN, or combinations thereof, not being limited thereto. The bottom spacer 304 may be formed on the doped layer 304 between the fin structures 302-1 through 302-4 and on the protrusion 311 by at least one of methods such as CVD, PEVD, PVD, ALD, PEALD, anisotropic deposition, etc., not being limited thereto. It is noted here that, due to the protrusion 311, the bottom spacer 304 conformally deposited on the protrusion 311 takes a corresponding protrusion shape as shown in FIG. 3H.

Figure 3I:
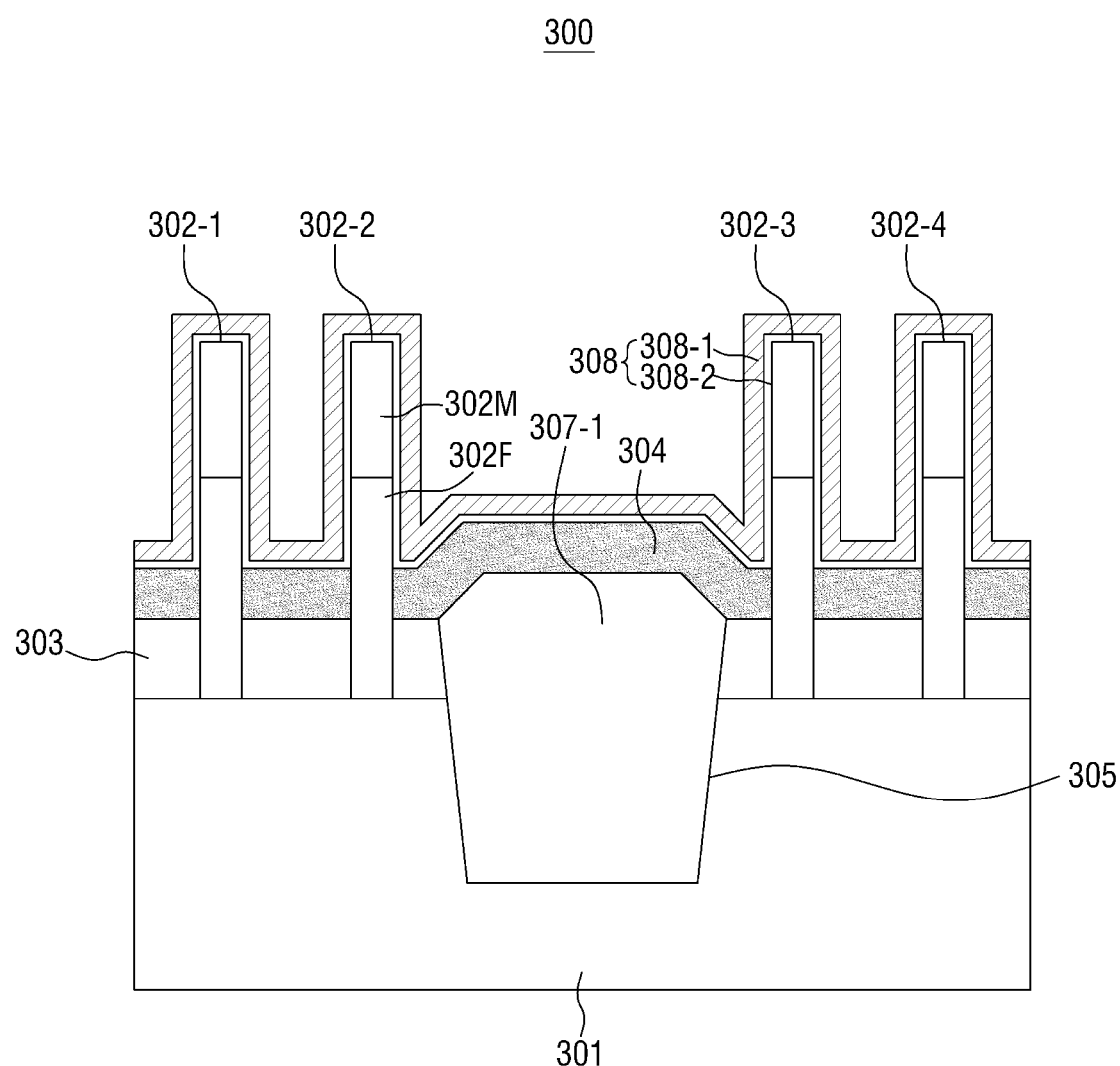

FIG. 3I shows that a gate structure 308 is deposited on the outer surfaces of the fin structures 302-1 through 302-4 and the top surface of the bottom spacer 304. Here, as described in reference to FIG. 2I, the deposition of the gate structure 308 may be performed by a method such as ALD not being limited thereto, and the gate structure 308 may include a conductor layer 308-1 formed of a metal or metal compound such as Cu, Al, Ti, Ta, W, Co, TiN, WN, TiAl, TiAlN, TaN, TiC, TaC, TiAlC, TaCN, TaSiN, or a combination thereof, not being limited thereto, and a high-κ layer 308-2 formed of a metal oxide material or a metal silicate such as Hf, Al, Zr, La, Mg, Ba, Ti, Pb, or a combination thereof, not being limited thereto.

Figure 3J:
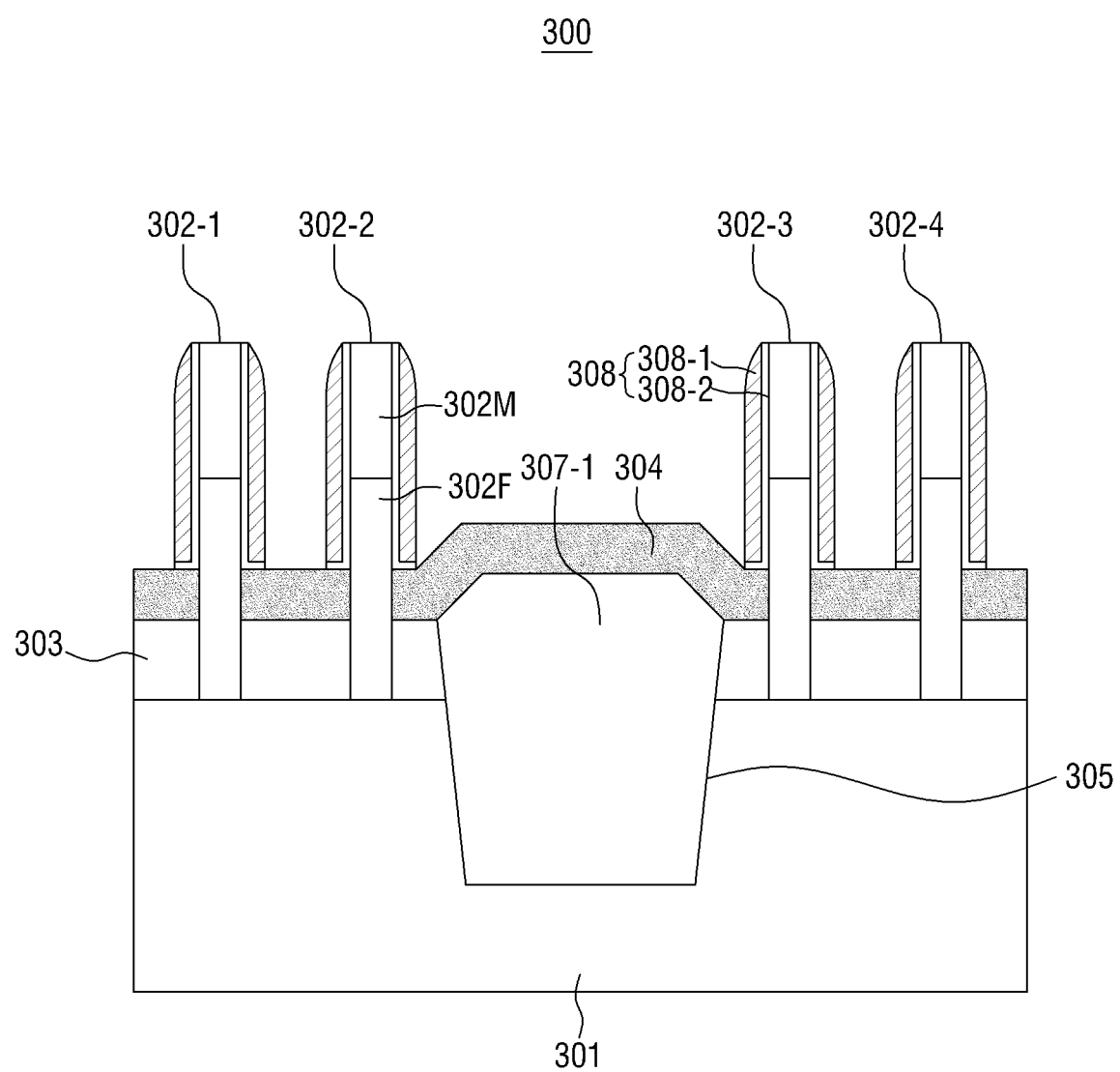

FIG. 3J shows that the gate structure 308 deposited in the process of FIG. 3I is etched by a method such as dry etching, not being limited thereto, to open the top surfaces of the fin structures 302-1 through 302-4 and the top surface of the bottom spacer 304, thereby to form a VFET device structure corresponding to the VFET device structure shown in FIG. 2J.

Here, it is noted that, unlike the processes of FIGS. 1H and 1I, when the gate structure 308 is formed and etched in the processes of FIGS. 3I and 3J, a residue of the gate structure 308 may not remain at the side surfaces of the bottom spacer 304 and portions of the side surfaces of the doped layer 303 forming the shallow trench 305. This is because the recess delay structure 310 is inserted in the STI dielectric 307 to delay the etching of the STI dielectric 307 in the process of FIG. 3G at a position of the shallow trench 305, thereby forming the STI structure 307-1 having the protrusion 311 to prevent formation of such residue of the gate structure 308. Thus, there may not be generated a short circuit between the residue of the gate structure 308 and a bottom S/D region formed at the side surfaces of the doped layer 303 as in the process of FIG. 1I. Accordingly, the method of manufacturing a VFET device structure according to the present embodiment may also prevent increase of unnecessary capacitance reducing AC performance a VFET device formed from the intermediate VFET device structure 100 and productivity degradation of the VFET device. Further, the method of manufacturing a VFET device structure according to the present embodiment may further prevent loss of the bottom spacer 304 compared to the method described in reference to FIGS. 2A through 2L.

It is further noted that, to be consistent with the inventive concept, a different process other than the etching process of FIGS. 3F and 3G using the delay recess structure 310 may be used as long as the etching of the STI dielectric 307 at the position above the shallow trench 305 can be delayed to prevent the residue of the gate structure 308 from remaining at the side surfaces of the bottom spacer 304 and portions of the side surfaces of the doped layer 203 forming the shallow trench 305. In addition, although the delayed etching according to the present embodiment generates the STI structure 307-1 having the protrusion 311 above the level of the top surfaces of the doped layer 303 and the bottom spacer 304 to prevent formation of the residue of the gate structure 308 in the shallow trench 305, the inventive concept is not limited thereto. According to an embodiment, the delayed etching may be controlled such that the top surface of the STI structure 307-1 is formed not to be below the level of the top surface of the doped layer 303 or the top surface of the bottom spacer 304 as long as the delayed etching can prevent formation of the residue of the gate structure 308 in the shallow trench 305 as shown in FIG. 1G.

Figure 3K:
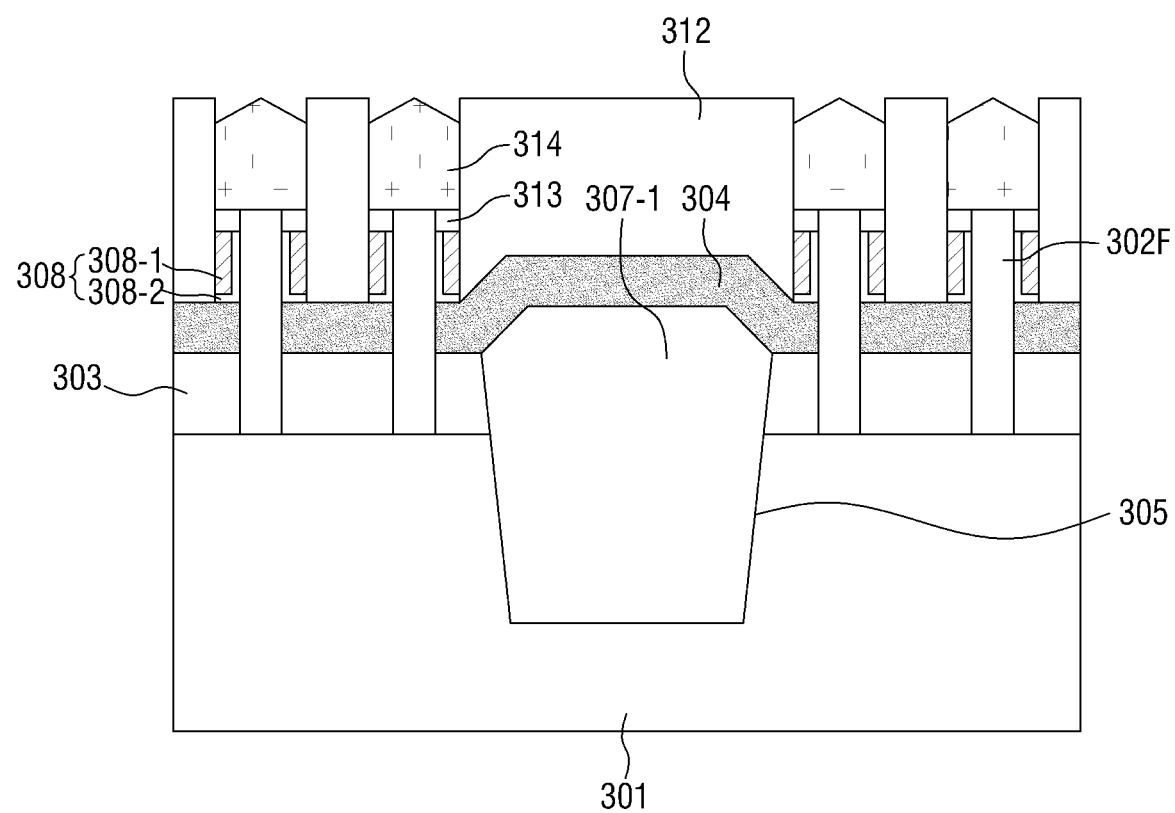
Figure 3L:
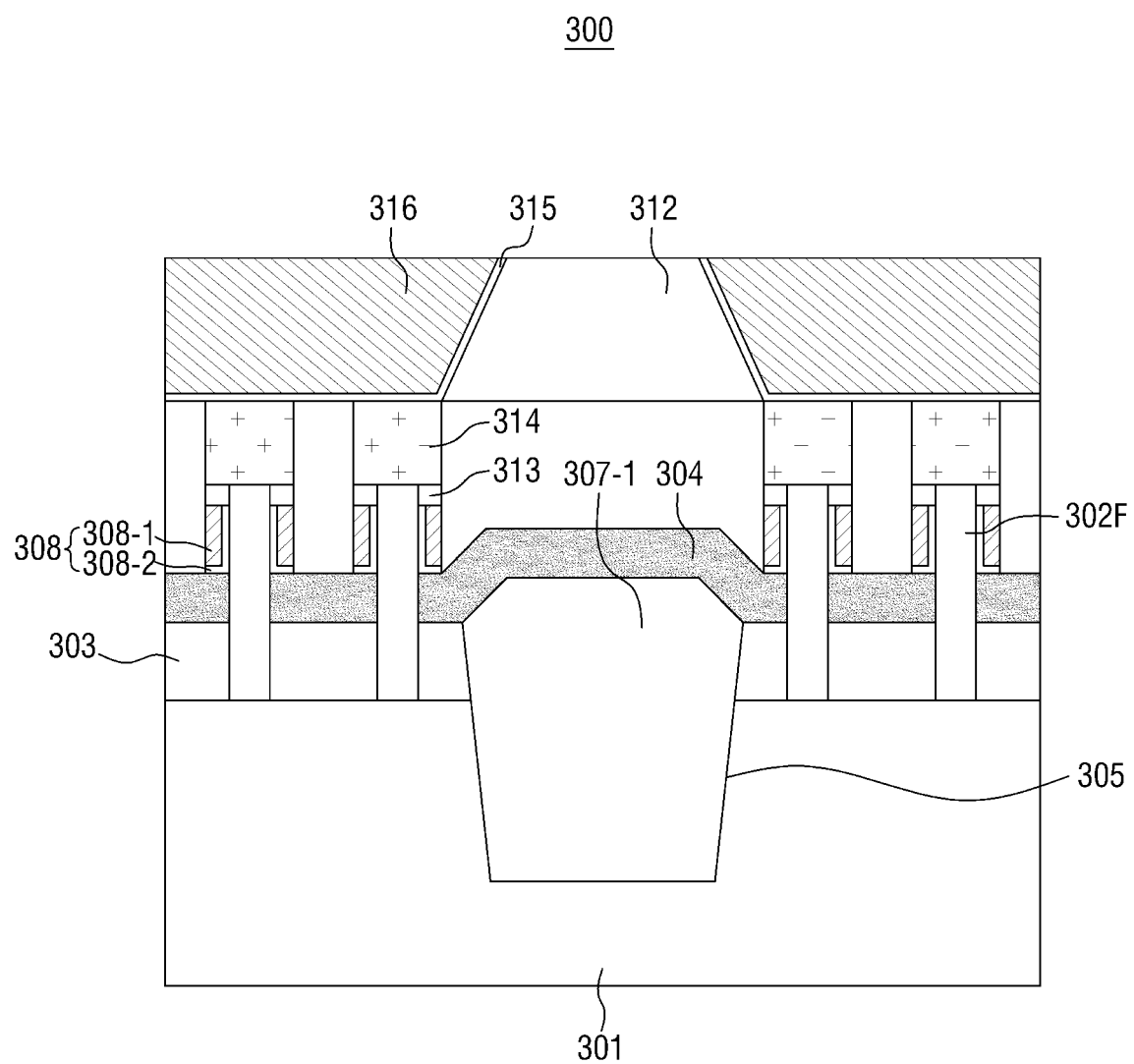

FIGS. 3K and 3L show that, after the fin structures 302-1 through 302-4 on which the gate structure 308 is deposited and etched in FIGS. 3I and 3J, the VFET device structure is planarized and/or etched again at least to remove the masks 302M from the fin structures 302-1 through 302-4, and further, an ILD layer 312, a top spacer 313, and a top S/D region 314 and are deposited or formed, and further, a contact liner 315 and a contact structure 316 are formed on the top S/D region 314, thereby to form a desired VFET device. Here, the ILD layer 312 formed of a material including nitride, oxide, or a combination thereof, not being limited thereto may be deposited between the fin structures 302-1 through 302-4. The top spacer 313 formed of a material similar to or different from that of the bottom spacer 304 may be deposited above the gate structure 308 to server to electrically isolate the gate structure 308 from the top S/D region 314. The top S/D region 314 may also be formed by epitaxially growing a semiconductor layer on the fin structures 302-1 through 302-4 from which the masks 302M are removed, and doping impurities therein.

The foregoing is illustrative of exemplary embodiments and is not to be construed as limiting thereof. Although a few exemplary embodiments have been described, those skilled in the art will readily appreciate that many modifications are possible in the above embodiments without materially departing from the inventive concept.

What is claimed is:

1. A method for manufacturing a vertical field effect transistor (VFET) device, the method comprising:
providing an intermediate VFET structure comprising a substrate, a plurality of fin structures formed thereon, and a doped layer formed on the substrate between the fin structures, the doped layer comprising a bottom source/drain (S/D) region, a bottom surface of the fin structures and a bottom surface of the doped layer being on a same plane;
forming a shallow trench through the doped layer and the substrate below a top surface of the substrate and between the fin structures, to isolate the fin structures from each other;
filling the shallow trench and a space between the fin structures with an insulating material;
etching the insulating material filled between the fin structures above a level of a top surface of the doped layer, except in the shallow trench, such that a shallow trench isolation (STI) structure having a top surface at or above the level of the top surface of the doped layer is formed in the shallow trench;
forming a plurality of gate structures on the fin structures, respectively; and
forming a top S/D region above the fin structures,
wherein the intermediate VFET structure further comprises a bottom spacer formed on the doped layer between the fin structures,
wherein the shallow trench is formed through the bottom spacer, the doped layer and the substrate between the fin structures, and
wherein the STI structure is formed in the shallow trench such that the top surface of the STI structure is positioned at or above a level of a top surface of the bottom spacer.

2. The method of claim 1, wherein the STI structure has a protrusion protruded above the level of the top surface of the doped layer.

3. The method of claim 1, further comprising inserting a recess delay structure in the insulating material at a position above the shallow trench prior to the etching the insulating material.

4. The method of claim 3, wherein the recess delay structure is inserted in the insulating material at a level same as a level of top surfaces of the fin structures.

5. The method of claim 3, wherein the insulating material and a material forming the recess delay structure have etch selectivity against each other.

6. The method of claim 5, wherein the insulating material is formed of a dielectric oxide material.

7. The method of claim 5, wherein the recess delay structure is formed of a material comprising a silicon nitride.

8. A method for manufacturing a vertical field effect transistor (VFET) device, the method comprising:
providing an intermediate VFET structure comprising a substrate, a plurality of fin structures formed thereon, and a doped layer formed on the substrate between the fin structures, the doped layer comprising a bottom source/drain (S/D) region, a bottom surface of the fin structures and a bottom surface of the doped layer being on a same plane;

forming a shallow trench through the doped layer and the substrate below a top surface of the substrate and between the fin structures, to isolate the fin structures from each other;

filling the shallow trench and a space between the fin structures with an insulating material;

etching the insulating material filled between the fin structures above a level of a top surface of the doped layer, except in the shallow trench, such that a shallow trench isolation (STI) structure having a top surface at or above the level of the top surface of the doped layer is formed in the shallow trench;

forming a plurality of gate structures on the fin structures, respectively; and forming a top S/D region above the fin structures, wherein the etching the insulating material is performed such that the insulating material at a position above the shallow trench is delay-etched compared to the insulating material at positions between the shallow trench and the fin structures.

9. A method for manufacturing a vertical field effect transistor (VFET) device, the method comprising:

providing an intermediate VFET structure comprising a substrate, a plurality of fin structures formed thereon, and a doped layer formed on the substrate between the fin structures, the doped layer comprising a bottom source/drain (S/D) region, a bottom surface of the fin structures and a bottom surface of the doped layer being on a same plane;

forming a shallow trench through the doped layer and the substrate below a top surface of the substrate and between the fin structures, to isolate the fin structures from each other;

filling the shallow trench and a space between the fin structures with an insulating material;

etching the insulating material filled between the fin structures above a level of a top surface of the doped layer, except in the shallow trench, such that a shallow trench isolation (STI) structure having a top surface at or above the level of the top surface of the doped layer is formed in the shallow trench;

forming a plurality of gate structures on the fin structures, respectively; and forming a top S/D region above the fin structures, wherein the method further comprises forming a bottom spacer on the doped layer between the fin structure and on the top surface of the STI structure after the etching the insulating material.

10. The method of claim 9, wherein a top surface of the bottom spacer on the top surface of the STI structure is higher than a top surface of the bottom spacer on the doped layer.

11. A method for manufacturing a vertical field effect transistor (VFET) device, the method comprising:

providing an intermediate VFET structure comprising a substrate, a plurality of fin structures formed thereon, and a doped layer formed on the substrate between the fin structures, the doped layer comprising a bottom source/drain (S/D) region;

forming a shallow trench through the doped layer and the substrate below a top surface of the substrate and between the fin structures, to isolate the fin structures from each other;

filling a space between the fin structures including the shallow trench with an insulating material;

etching the insulating material such that the insulating material filled between the fin structure and above the shallow trench is delay-etched compared to the insulating material filled in positions between the shallow trench and the fin structures to form a shallow trench isolation (STI) structure in the shallow trench;

forming a plurality of gate structures on the fin structures, respectively; and forming a top S/D region above the fin structure.

12. The method of claim 11, wherein the STI structure has a protrusion protruded above a level of a top surface of the doped layer.

13. A vertical field effect transistor (VFET) device comprising:

a substrate;

a doped layer formed on the substrate by doping impurities, the doped layer comprising a bottom source/drain (S/D) region;

a bottom spacer formed on the doped layer;

a plurality of fin structures vertically formed on the substrate above the doped layer;

a plurality gate structures respectively surrounding the fin structures;

a top S/D region formed above the fin structures;

a shallow trench isolation (STI) structure filling a shallow trench formed through the doped layer and the substrate below a top surface of the substrate and between the fin structures and an interlayer dielectric (ILD) structure separately formed above the STI structure and between the gate structures, wherein a top surface of the STI structure is at or above a level of a top surface of the bottom spacer, wherein a bottom surface of the fin structures and a bottom surface of the doped layer are on a same plane.

14. The VFET device of claim 13, wherein the STI structure has a protrusion protruded above the level of the top surface of the doped layer.

15. The VFET device of claim 14, wherein the protrusion of the STI structure takes a shape of trapezoid above the level of the top surface of the doped layer.

16. The VFET device of claim 13, wherein the STI structure is a structure formed before the gate structures are formed to surround the fin structures.

17. The VFET device of claim 16, wherein the STI structure has a protrusion protruded above the level of the top surface of the bottom spacer.

18. A vertical field effect transistor (VFET) device comprising:

a substrate;

a doped layer formed on the substrate by doping impurities, the doped layer comprising a bottom source/drain (S/D) region;

a plurality of fin structures vertically formed on the substrate above the doped layer;

a top S/D region formed above the fin structures; and a shallow trench isolation (STI) structure filling a shallow trench formed through the doped layer and the substrate below a top surface of the substrate and between the fin structures, wherein a top surface of the STI structure is at or above a level of a top surface of the doped layer, wherein a bottom surface of the fin structures and a bottom surface of the doped layer are on a same plane, and wherein the VFET further comprises a bottom spacer formed on the doped layer and the top surface of the STI structure.

* * * * *